United States Patent
Chen et al.

(10) Patent No.: US 10,971,202 B1
(45) Date of Patent: Apr. 6, 2021

(54) LOW LATENCY DATA TRANSFER

(71) Applicant: SanDisk Technologies LLC, Addison, TX (US)

(72) Inventors: Chen Chen, Mountain View, CA (US); Yenlung Li, San Jose, CA (US); Min Peng, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/849,827

(22) Filed: Apr. 15, 2020

(51) Int. Cl.
*G11C 16/26* (2006.01)
*G11C 7/22* (2006.01)
*G11C 7/10* (2006.01)

(52) U.S. Cl.
CPC .............. *G11C 7/222* (2013.01); *G11C 7/106* (2013.01); *G11C 7/1039* (2013.01); *G11C 7/1087* (2013.01)

(58) Field of Classification Search
CPC ....... G11C 7/222; G11C 7/1039; G11C 7/106; G11C 7/1087
USPC ..................................................... 365/233.1
See application file for complete search history.

(56) References Cited

U.S. PATENT DOCUMENTS

| | | | |
|---|---|---|---|
| 6,560,146 B2 | 5/2003 | Cernea | |
| 7,170,802 B2 | 1/2007 | Cernea et al. | |
| 8,681,548 B2 | 3/2014 | Liu et al. | |
| 10,043,558 B2 | 8/2018 | Shah et al. | |
| 2012/0182779 A1 | 7/2012 | Fukuda | |
| 2015/0078100 A1 | 3/2015 | Nakayama et al. | |
| 2017/0309340 A1* | 10/2017 | Shah | G11C 11/5642 |
| 2019/0303236 A1 | 10/2019 | Ellis et al. | |

OTHER PUBLICATIONS

U.S. Appl. No. 16/722,538, filed Dec. 20, 2019.
U.S. Appl. No. 16/674,257, filed Nov. 5, 2019.

* cited by examiner

*Primary Examiner* — Xiaochun L Chen
(74) *Attorney, Agent, or Firm* — Vierra Magen Marcus LLP

(57) ABSTRACT

Apparatuses and techniques are described for transferring data out of a memory device with low latency. Data can be stored in data transfer latches for NAND strings arranged in columns in divisions of a block. Data can be output from the data transfer latches for different columns in different divisions in each transfer. For example, the data output can include data from an nth column in some divisions and an $n+1^{st}$ column in other divisions. This avoids outputting unwanted data at the start of a data transfer. The data from the data transfer latches is output to a data pipeline and then to a set of control latch circuits. The data can be clocked out from a last control latch circuit of the set in a desired division order by use of separate multiplexer control signals for the control latch circuits.

20 Claims, 19 Drawing Sheets

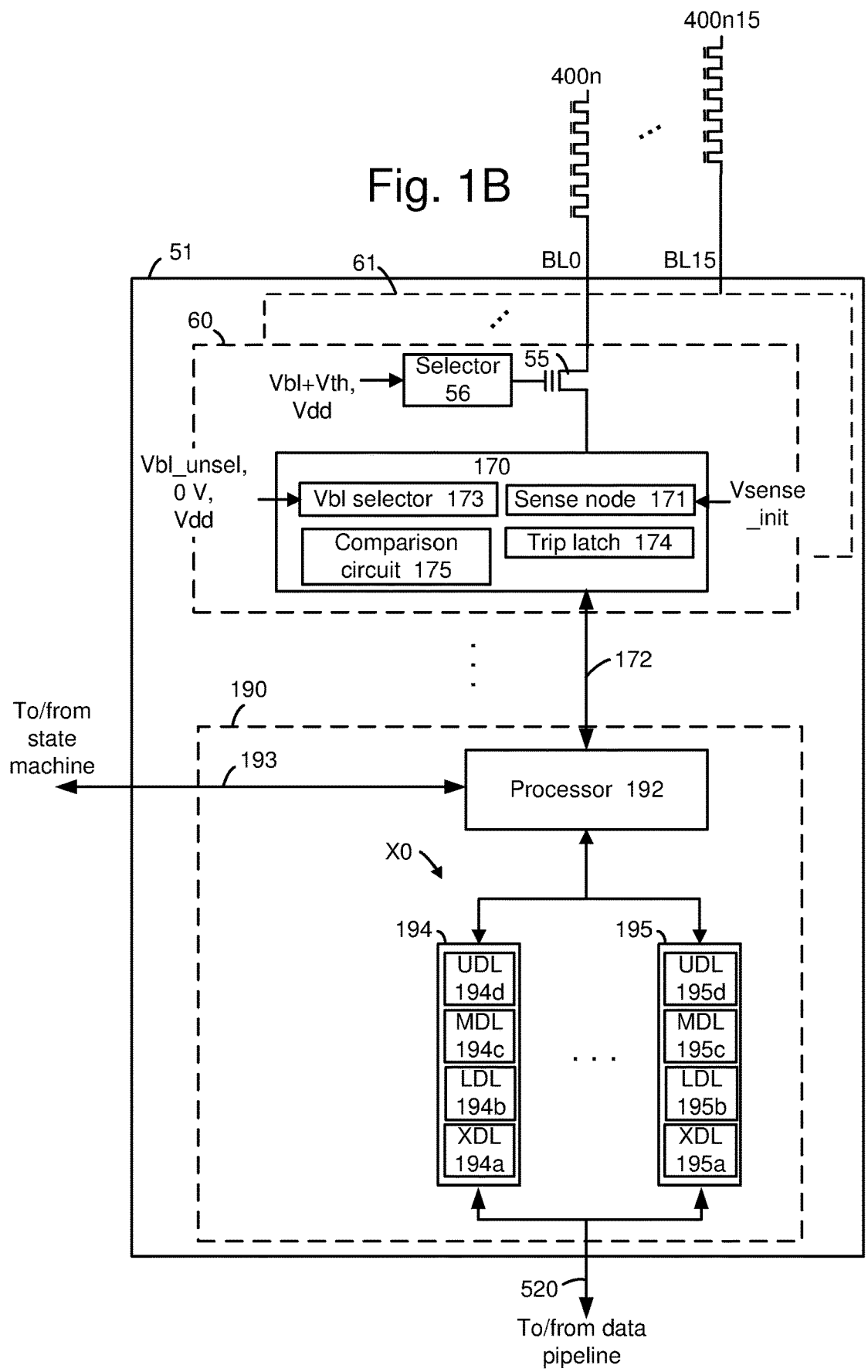

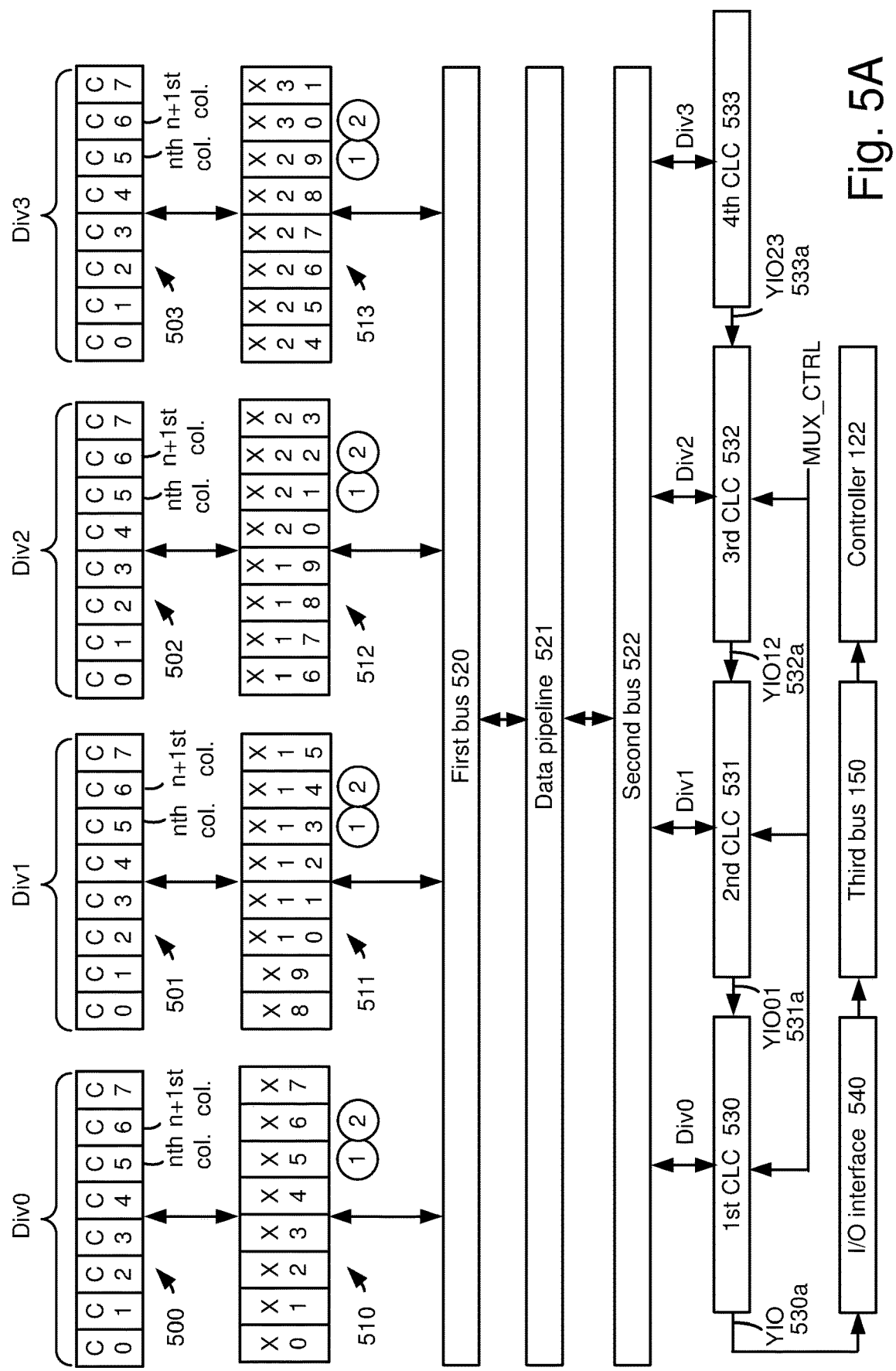

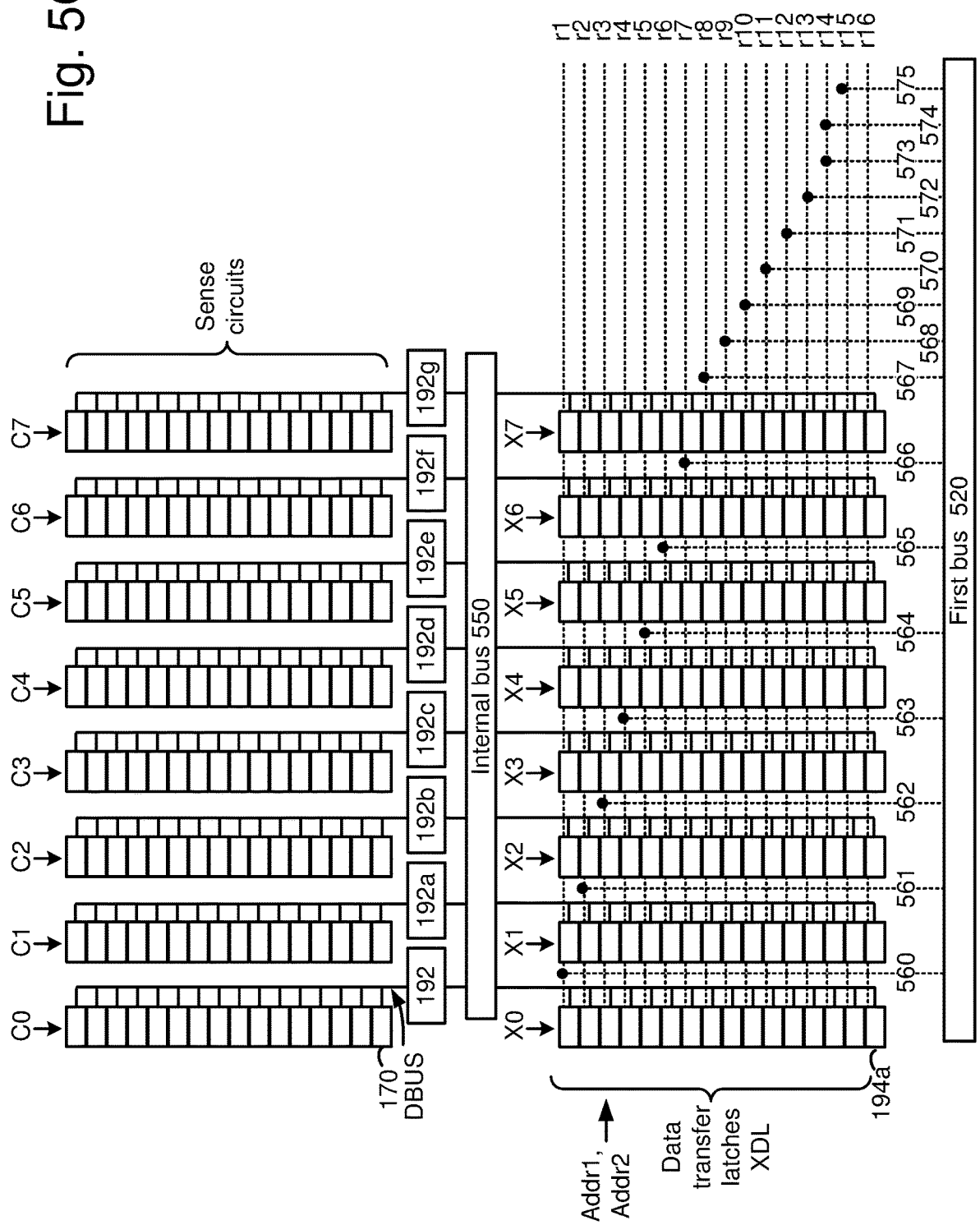

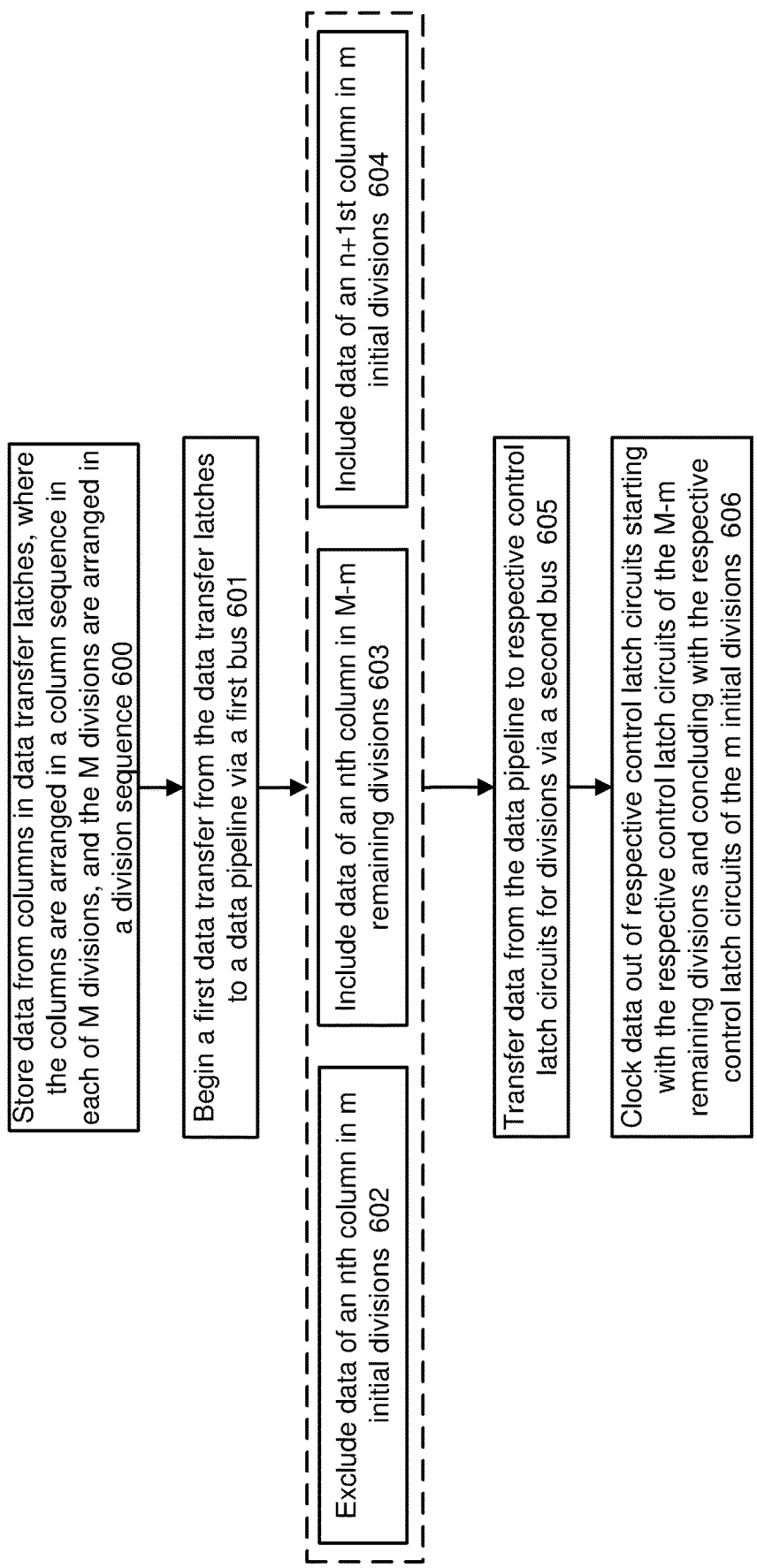

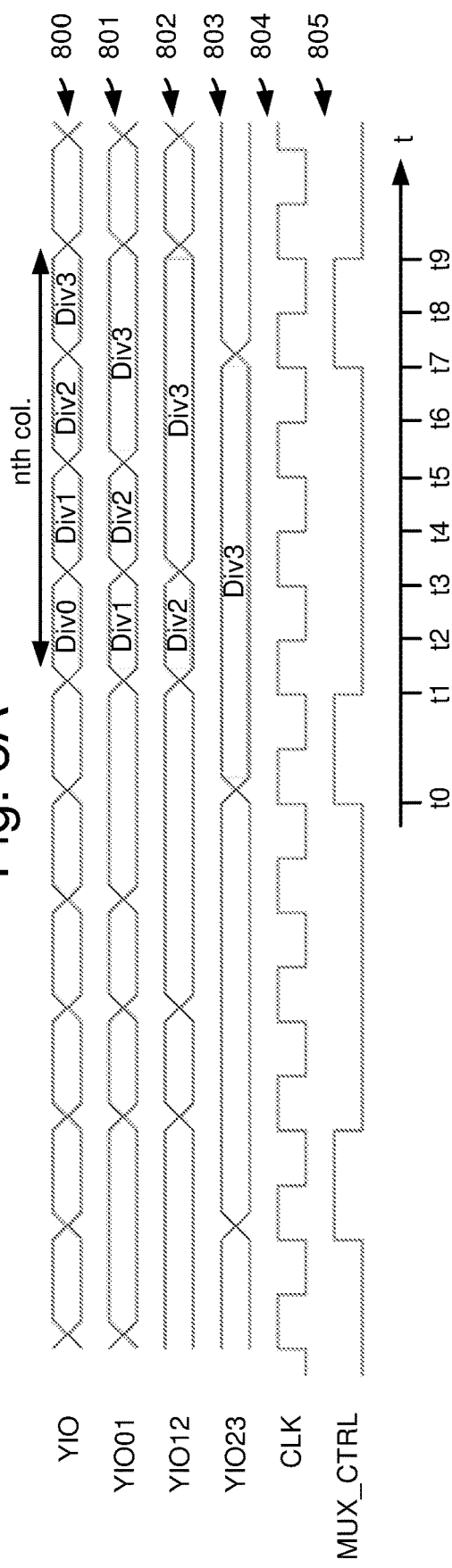
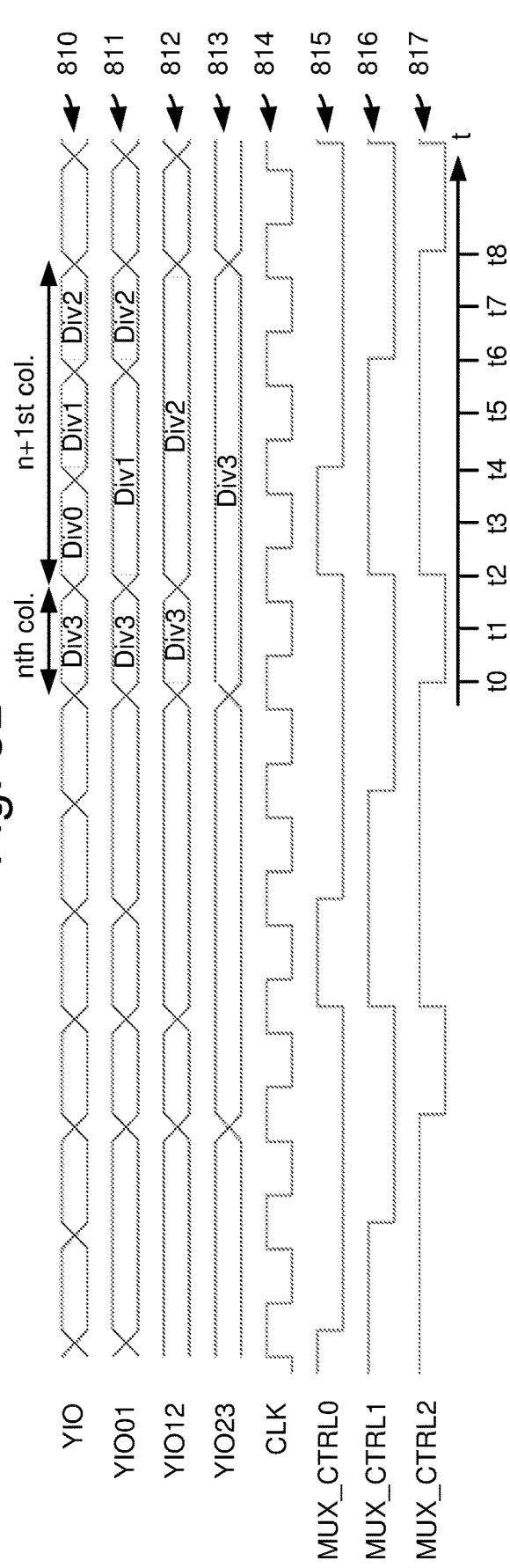
Fig. 8A
Fig. 8B

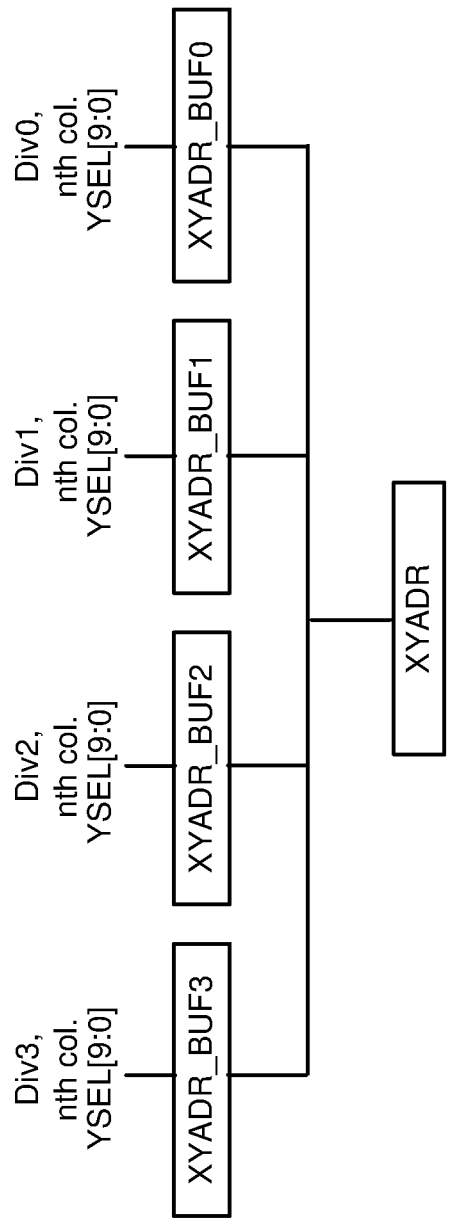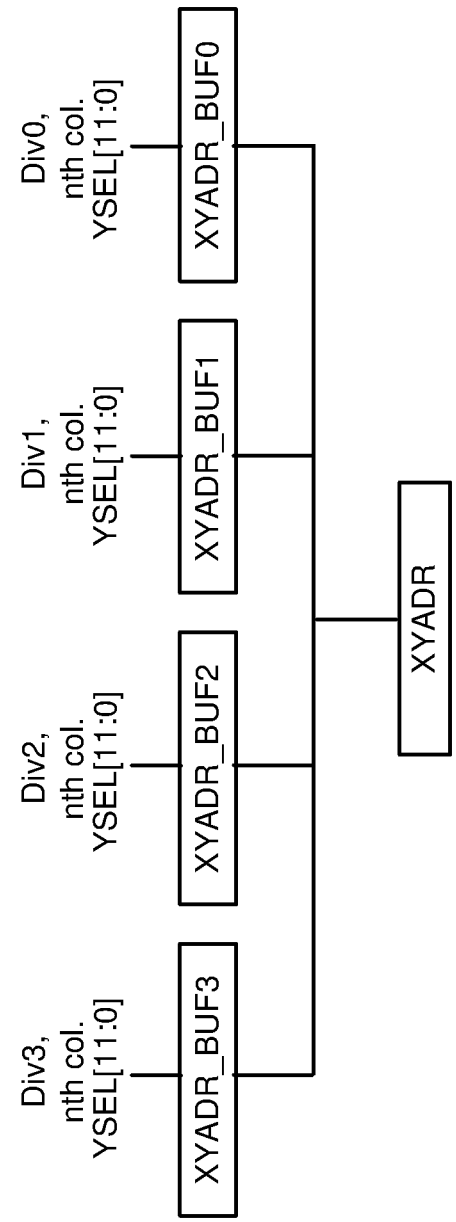

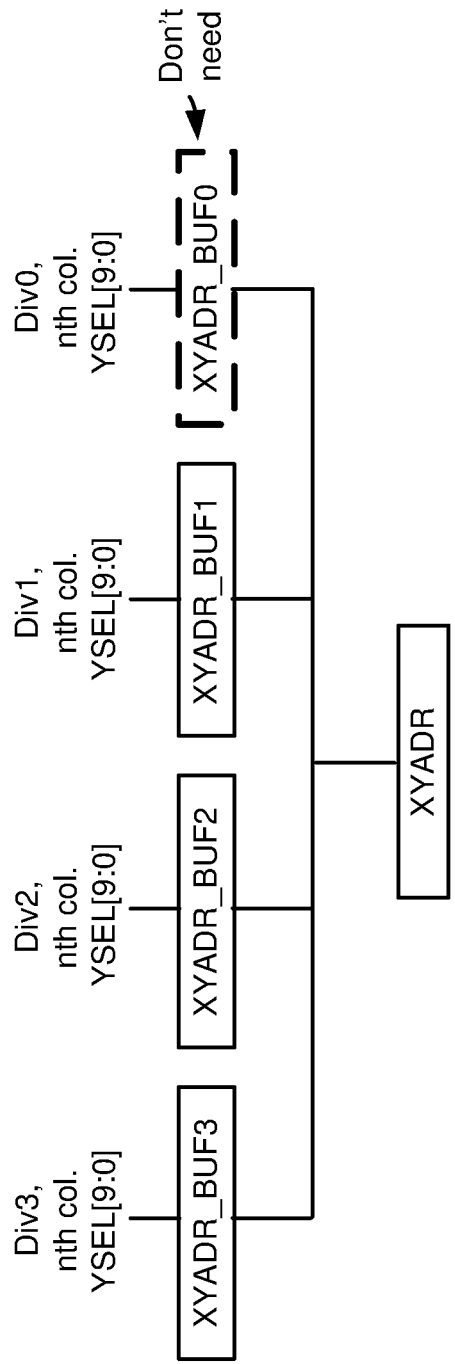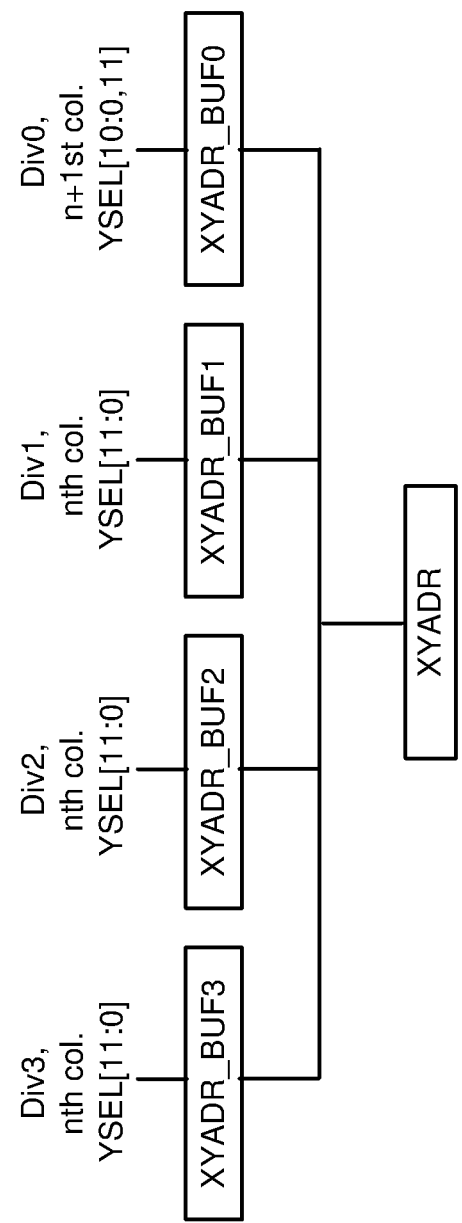

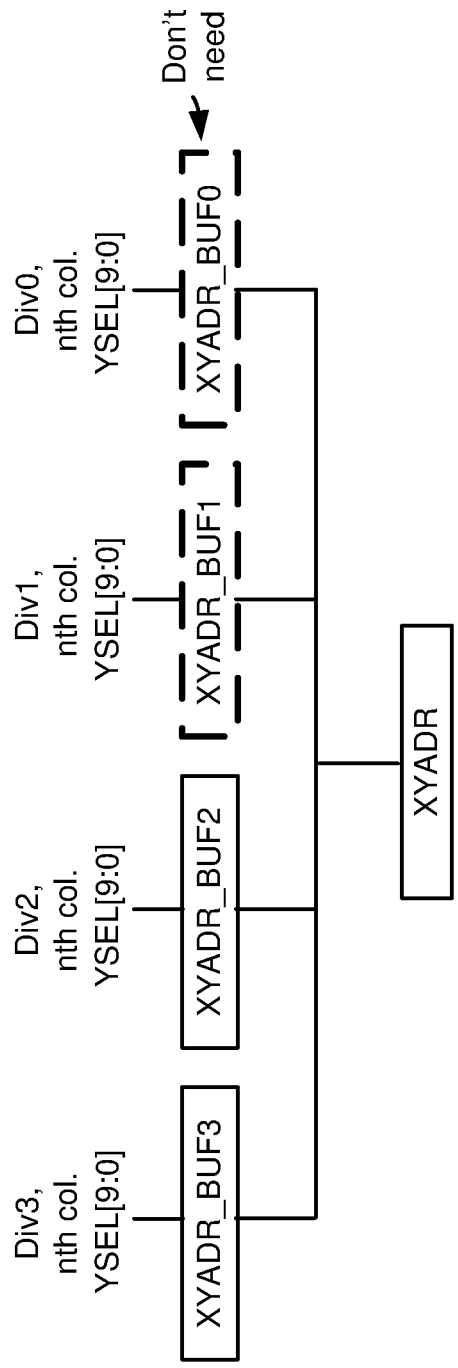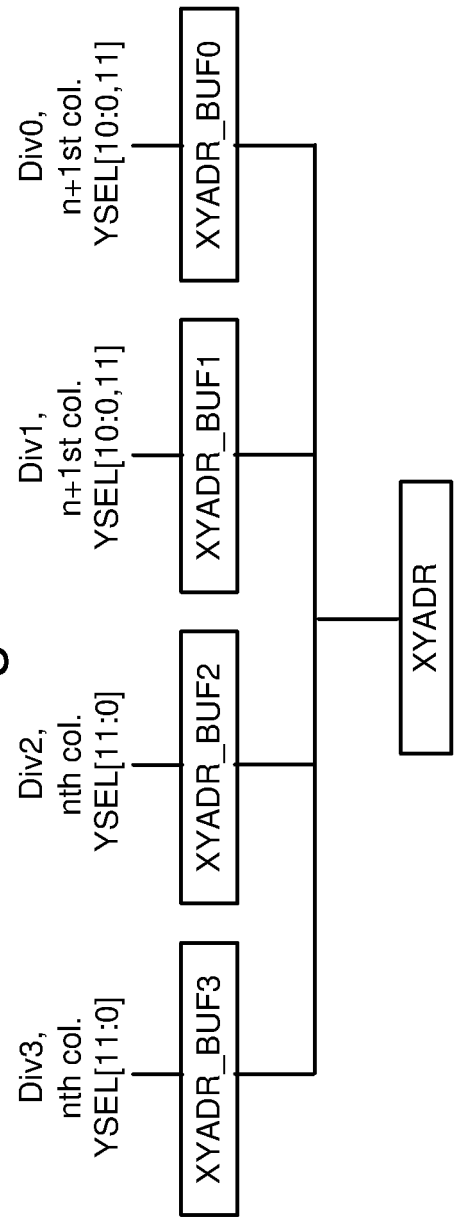

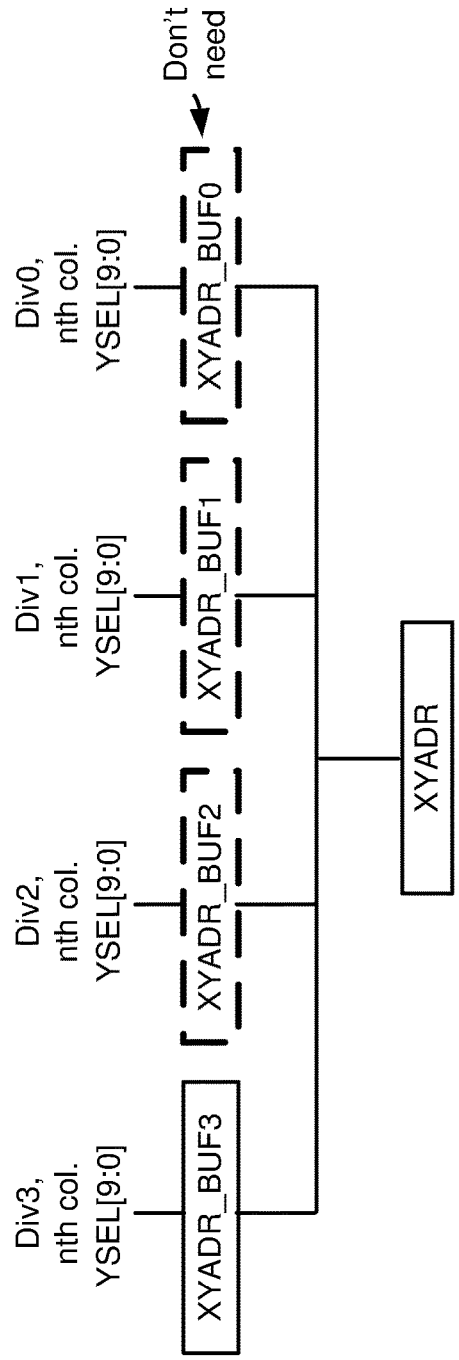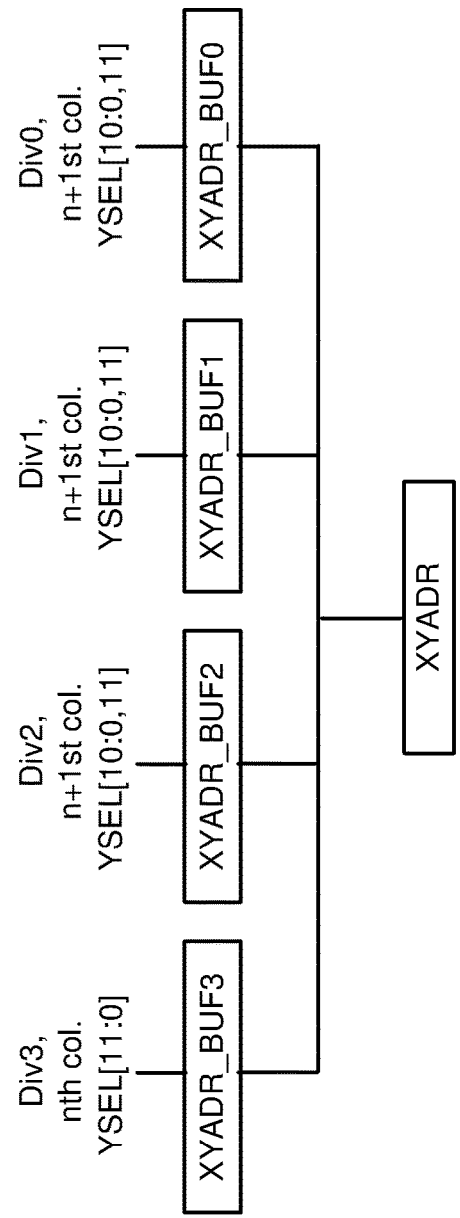

LOW LATENCY DATA TRANSFER

BACKGROUND

The present technology relates to the operation of storage and memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device can include memory cells which may be arranged in series, in NAND strings (e.g., NAND chains), for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 1B is a block diagram depicting one embodiment of the sense block 51 of FIG. 1.

FIG. 5A depicts an example configuration of a memory device consistent with FIGS. 1A and 4A-4C, showing a comparative example of transferring data out of latches, including data of a same column in each division in each transfer.

FIG. 5C depicts an example configuration of a circuit consistent with FIGS. 1B and 5B, where data is output from columns C0-C7 in Div0 via sets of data transfer latches X0-X7.

FIG. 6A depicts a flowchart of an example process for transferring data from a set of latches in a first data transfer, consistent with FIG. 5B.

FIG. 8A depicts example signals for clocking data out of the control latch circuits of FIGS. 5A and 7A.

FIG. 8B depicts example signals for clocking data out of the control latch circuits of FIGS. 5B and 7B, consistent with the processes of FIGS. 6A and 6B.

FIG. 9A depicts an example of column addresses for transferring data for use with the example of FIGS. 5A and 7A, where the transfer comprises an nth column of Div0-Div3, and no data is discarded.

FIG. 9B depicts an example of column addresses for transferring data for use with the example of FIGS. 5B and 7B, where the transfer comprises an nth column of Div0-Div3, and no data is discarded.

FIG. 10A depicts an example of column addresses for transferring data for use with the example of FIGS. 5A and 7A, where the transfer comprises an nth column of Div0-Div3 and data from the nth column of Div0 is discarded.

FIG. 10B depicts an example of column addresses for transferring data for use with the example of FIGS. 5B and 7B, where the transfer comprises an nth column of Div1-Div3 and an $n+1^{st}$ column of Div0, and no data is discarded.

FIG. 11A depicts an example of column addresses for transferring data for use with the example of FIGS. 5A and 7A, where the transfer comprises an nth column of Div0-Div3 and data from the nth column of Div0 and Div1 is discarded.

FIG. 11B depicts an example of column addresses for transferring data for use with the example of FIGS. 5B and 7B, where the transfer comprises an nth column of Div2 and Div3 and an $n+1^{st}$ column of Div0 and Div1, and no data is discarded.

FIG. 12A depicts an example of column addresses for transferring data for use with the example of FIGS. 5A and 7A, where the transfer comprises an nth column of Div0-Div3 and data from the nth column of Div0-Div2 is discarded.

FIG. 12B depicts an example of column addresses for transferring data for use with the example of FIGS. 5B and 7B, where the transfer comprises an nth column of Div3 and an $n+1^{st}$ column of Div0-Div2, and no data is discarded.

DETAILED DESCRIPTION

Apparatuses and techniques are described for transferring data out of a memory device with low latency.

Figure 4A:
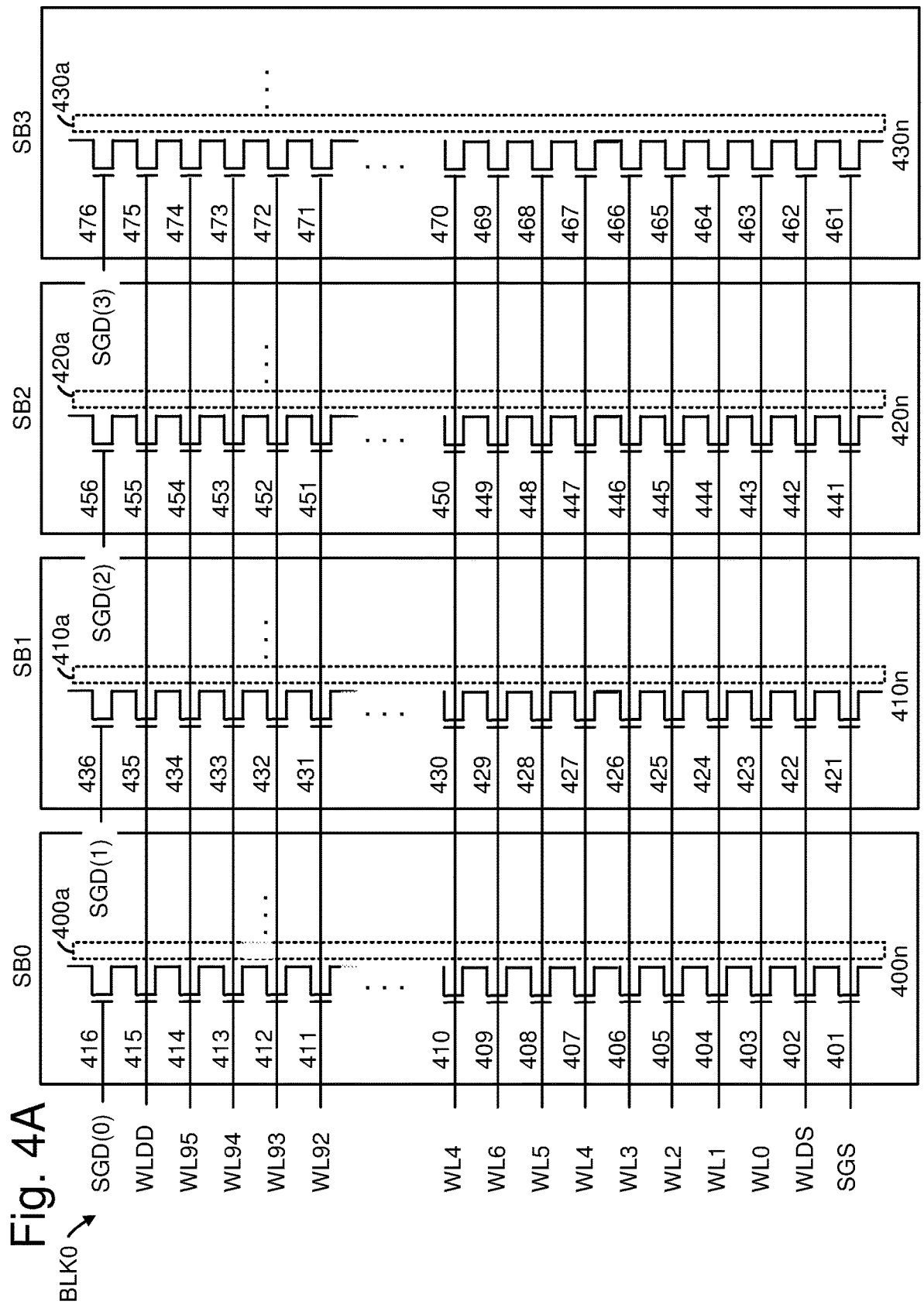
FIG. 4A depicts an example view of NAND strings in a block BLK0 in the memory structure 126 of FIG. 1A.

In some memory devices, memory cells are joined to one another such as in NAND strings in a block or sub-block. Referring to FIG. 4A, for example, each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string or set of connected memory cells, which is connected to a source line. Further, the memory cells can be arranged with a common control gate line (e.g., word line) which acts a control gate. A set of word lines extends from the source-side of a block to the drain-side of a block. Memory cells can be connected in other types of strings and in other ways as well.

For example, in a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells. In a 2D memory structure, the memory cells may be arranged in horizontal NAND strings on a substrate.

After a block of memory cells is erased in an erase operation, programming can occur. During a programming operation, the memory cells are programmed according to a word line programming order. For example, the programming may start at the word line at the source-side of the block and proceed to the word line at the drain-side of the block, one word line at a time. A word line can also be programmed in a sub-block programming order, one sub-block at a time, extending from SB0 to SB3, for example, when there are four sub-blocks (FIG. 4A).

Each memory cell may be associated with a data state according to write data in a program command. Based on its data state, a memory cell will either remain in the erased (Er) state or be programmed to a programmed data state. For example, in a one bit per cell memory device, there are two data states including the erased state and the programmed state. In a two-bit per cell memory device, there are four data states including the erased state and three programmed data states referred to as the A, B and C data states. In a three-bit per cell memory device, there are eight data states including the erased state and seven programmed data states referred to as the A, B, C, D, E, F and G data states (see FIG. 2B). In a four-bit per cell memory device, there are sixteen data states, including the erased state S0 and fifteen programmed data states S1-S15. Each data state can be represented by a range of threshold voltages (Vth) in the memory cells.

After the memory cells are programmed, the data can be read back in a read operation. A read operation can involve applying a series of read voltages to a word line while sensing circuitry determines whether cells connected to the word line are in a conductive (turned on) or non-conductive (turned off) state. If a cell is in a non-conductive state, the Vth of the memory cell exceeds the read voltage. The read voltages are set at levels which are expected to be between the threshold voltage levels of adjacent data states. Moreover, during the read operation, the voltages of the unselected word lines are ramped up to a read pass level or turn on level which is high enough to place the unselected memory cells in a strongly conductive state, to avoid interfering with the sensing of the selected memory cells. A word line which is being programmed or read is referred to as a selected word line, WLn. A read operation can involve reading pages of data, one at a time. See FIG. 2A. A word line can be read one sub-block at a time, in one approach.

When data is read from a memory cell, it can be stored in a data transfer latch such as one of the XDL latches depicted in FIG. 1B. The data transfer latches can also store data in other situations. The memory cells can be read in parallel so that the data transfer latches concurrently store data to be output. However, this is too much data to output in parallel. One approach is to divide the memory cells in a block into divisions, divide the divisions into columns, and output a unit of data from one or more columns in each division in parallel. A column can represent a set of contiguous NAND strings such as 16 NAND strings, for example, which store a word of data on one word line. As depicted in FIG. 5A, for example, a block can be divided into divisions Div0-Div3, where each division includes columns C0-C7.

The parallel outputting of data from the data transfer latches can include a unit of data from each division. After a unit of data is output from a particular nth column of each division in an output cycle, another cycle can begin in which a unit of data is output from an $n+1^{st}$ column of each division, and so forth in successive cycles. "n" denotes a number or index of a column.

However, in many cases the data which is output from one or more divisions is not needed by the controller. In this case, the unneeded data is discarded. This results in a time penalty. Generally, there is a continuing desire to reduce the time used in outputting data from the data transfer latches.

Figure 5B:
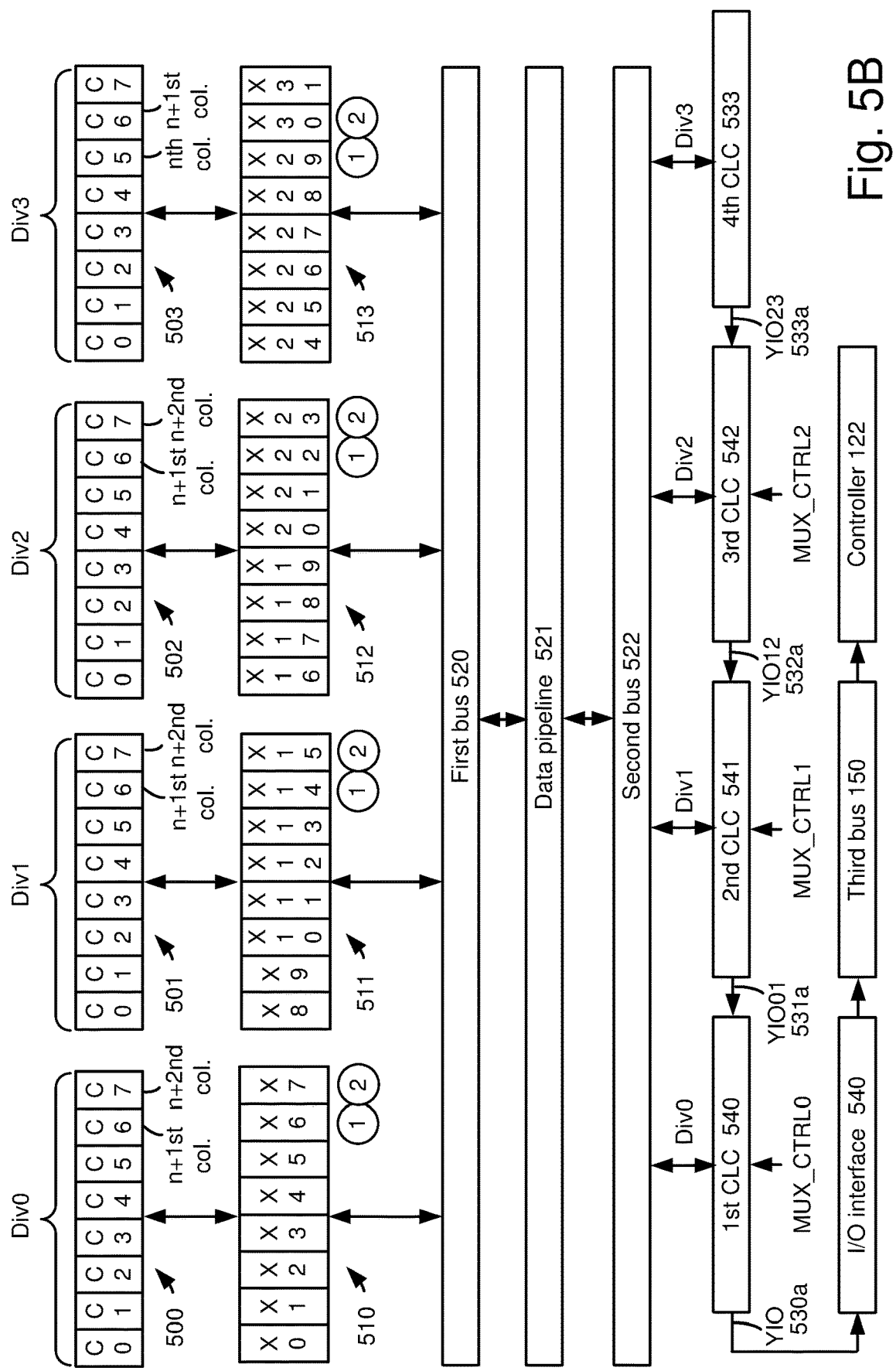
FIG. 5B depicts an example configuration of a memory device consistent with FIGS. 1A and 4A-4C, showing an example of transferring data out of latches, including data of different columns in different divisions in each transfer.

Techniques provided herein address the above and other issues. In one aspect, the output of data from the data transfer latches can include data from an nth column in some divisions and an $n+1^{st}$ column in other divisions. Referring to FIG. 5B, for example, a first transfer can include data from an nth column (e.g., C5) in Div3, and from an $n+1^{st}$ column (e.g., C6) in Div0-Div2, as represented by the circled "1's." A following second transfer can include data from an $n+1^{st}$ column (e.g., C6) in Div3, and from an $n+2^{nd}$ column (e.g., C7) in Div0-Div2, as represented by the circled "2's."

In another aspect, the data from the data transfer latches is output to a set of control latch circuits, where there are one or more control latch circuits for each division. For example, see the control latch circuits 530-533 in FIGS. 5B and 7B. The data can be clocked out from the first control latch circuit 540 in a desired division order by use of multiplexer control signals MUX_CTRL0-MUX_CTRL2. For example, data of an nth column can be clocked out from Div3, then data of an $n+1^{st}$ column can be clocked out from Div0, then data of an $n+1^{st}$ column can be clocked out from Div1, and finally data of an $n+1^{st}$ column can be clocked out from Div2.

These and other features are discussed further below.

Figure 1A:
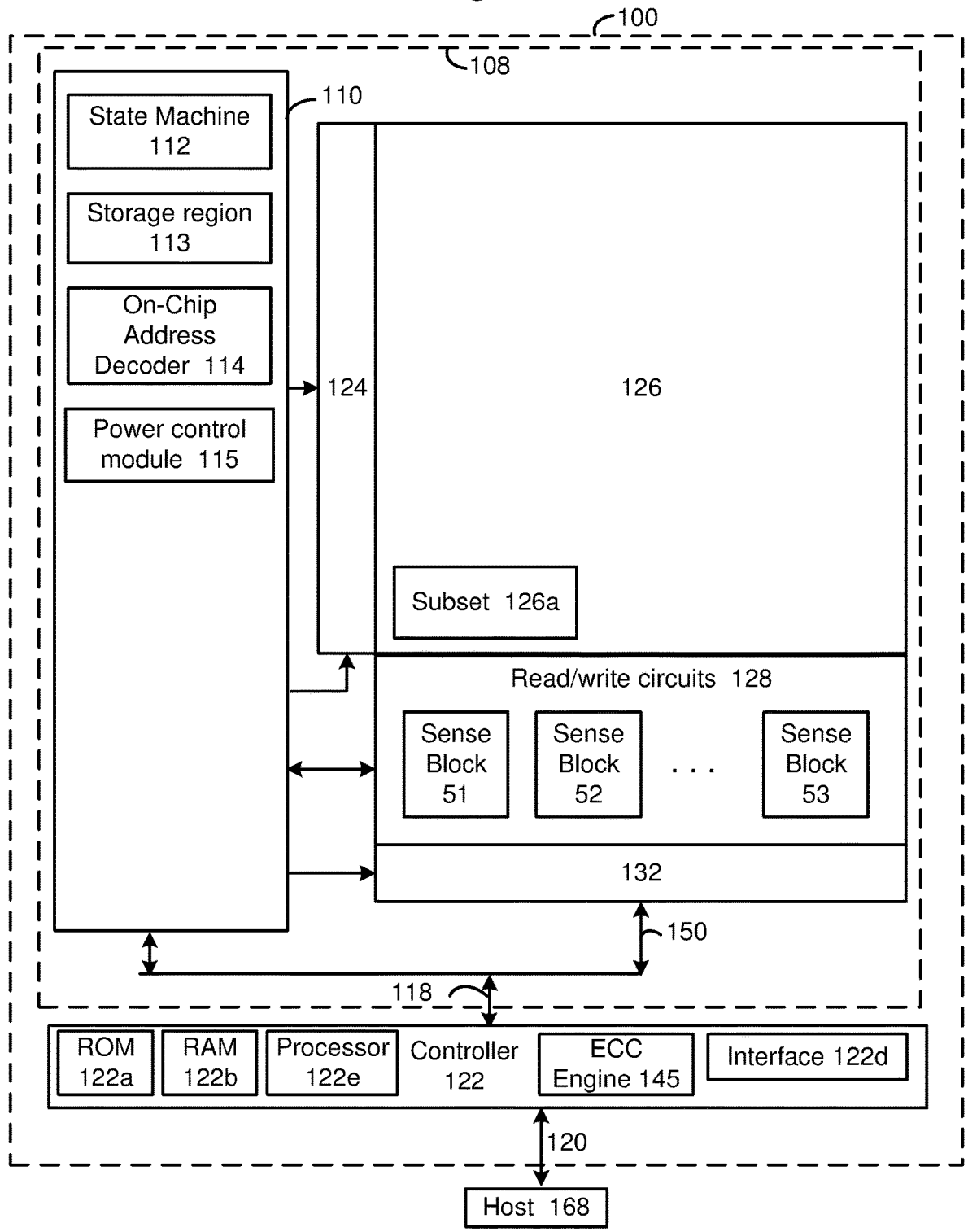
FIG. 1A is a block diagram of an example storage device.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 168 and controller 122 via a first data bus 120, and between the controller and the one or more memory die 108 via lines 118. A bus 150 can be used to communicate data between the controller 122 and an input/output interface 540 in the column decoder 132, consistent with FIGS. 5A and 5B.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, and a power control module 115 (power control circuit). A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 115, sense blocks 51, 52, . . . , 53, 0read/write circuits 128, controller 122, and so forth.

The off-chip controller 122 (which in one embodiment is an electrical circuit) may comprise a processor 122*e*, memory such as ROM 122*a* and RAM 122*b* and an error-correction code (ECC) engine 145. The ECC engine can correct a number of read errors. The RAM 122*b* can be a DRAM.

A memory interface 122*d* may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122*d*.

The memory in the controller 122, such as such as ROM 122*a* and RAM 122*b*, comprises code such as a set of instructions, and the processor is operable to execute the set of instructions to provide the functionality described herein. Alternatively or additionally, the processor can access code from a subset 126*a* of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122*e* fetches the boot code from the ROM 122*a* or the subset 126*a* for execution, and the boot code initializes the system components and loads the control code into the RAM 122*b*. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable m devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B is a block diagram depicting one embodiment of the sense block 51 of FIG. 1. An individual sense block 51 is partitioned into one or more core portions, referred to as sense circuits 60, . . . , 61 or sense amplifiers, and a common portion, referred to as a managing circuit 190. In one embodiment, there is a separate sense circuit for each bit line/NAND string in a column of NAND strings, and one common managing circuit 190 for the set of sense circuits. For example, the sense circuits 60, . . . , 61 can be connected to bit lines BL0-BL15 which in turn are connected to NAND strings 400$n$-400$n$15, respectively. See also FIG. 4B. A column could comprise sixteen NAND strings connected to sixteen sense circuits, as in this example. Each of the sense circuits in a group communicates with the associated managing circuit via data bus 172. Thus, there are one or more managing circuits which communicate with the sense circuits of a set of storage elements (memory cells).

The sense circuit 60, as an example, comprises a circuit 170 that performs sensing by determining whether a conduction current in a connected bit line is above or below a predetermined threshold level. The sensing can occur in a read or verify operation. The sense circuit also supplies a bit line voltage during the application of a program voltage in a program operation.

The sense circuit may include a Vbl selector 173, a sense node 171, a comparison circuit 175 and a trip latch 174. During the application of a program voltage, the Vbl selector 173 can pass Vbl_unsel (e.g., 2 V) to a bit line connected to a memory cell which is inhibited from programmed, or 0 V to a bit line connected to a memory cell which is being programmed in the current program loop. A transistor 55 (e.g., an nMOS) can be configured as a pass gate to pass Vbl from the Vbl selector 173, by setting the control gate voltage of the transistor sufficiently high, e.g., higher than the Vbl passed from the Vbl selector. For example, a selector 56 may pass a power supply voltage Vdd, e.g., 3-4 V to the control gate of the transistor 55.

During sensing operations such as read and verify operations, the bit line voltage is set by the transistor 55 based on the voltage passed by the selector 56. The bit line voltage is roughly equal to the control gate voltage of the transistor minus its Vth (e.g., 1 V). For example, if Vbl+Vth is passed by the selector 56, the bit line voltage will be Vbl. This assumes the source line is at 0 V. The transistor 55 clamps the bit line voltage according to the control gate voltage and acts a source-follower rather than a pass gate. The Vbl selector 173 may pass a relatively high voltage such as Vdd which is higher than the control gate voltage on the transistor 55 to provide the source-follower mode. During sensing, the transistor 55 thus charges up the bit line.

In one approach, the selector 56 of each sense circuit can be controlled separately from the selectors of other sense circuits, to pass Vbl or Vdd. The Vbl selector 173 of each sense circuit can also be controlled separately from the Vbl selectors of other sense circuits.

During sensing, the sense node 171 is charged up to an initial voltage such as 3 V. The sense node is then connected to the bit line via the transistor 55, and an amount of decay of the sense node is used to determine whether a memory cell is in a conductive or non-conductive state. The comparison circuit 175 is used to compare the sense node voltage to a trip voltage at a sense time. If the sense node voltage decays below the trip voltage Vtrip, the memory cell is in a conductive state and its Vth is at or below the voltage of the verification signal. If the sense node voltage does not decay below Vtrip, the memory cell is in a non-conductive state and its Vth is above the voltage of the verification signal. The sense circuit 60 includes a trip latch 174 that is set by the comparison circuit 175 based on whether the memory cell is in a conductive or non-conductive state. The data in the trip latch can be a bit which is read out by the processor 192.

The managing circuit 190 comprises a processor 192, sixteen example sets of data latches 194, . . . 195 and a first bus 520 to/from a data pipeline 521. See also FIGS. 5A and 5B. A set of data latches is provided for each sense circuit and NAND string. For example, the sets of data latches 194, . . . , 195 are provided for sense circuits 60, . . . , 61, respectively. In a three bit per cell embodiment, each set of data latches may comprise data storage latches denoted by LDL, MDL and UDL and a data transfer latch denoted by XDL. The sets of latches 194, . . . , 195 include XDL data storage latches 194a, . . . , 195a, LDL data storage latches 194b, . . . , 195b, MDL data storage latches 194c, . . . , 195c and UDL data storage latches 194d, . . . , 195d, respectively. The data storage latches can store read or write data in a read or program operation, respectively. For example, LDL, MDL and UDL are provided for storing a bit of read and write data for a lower, middle and upper page of data.

In each set of latches, each bit of data in the data storage latches passes through the XDL latch, in one approach. For example, in a read operation consistent with FIG. 2A, for a lower page, a bit of read data can be obtained using VrA and another bit obtained using VrE. The bit obtained using VrA can be output to a page register via the XDL latch, followed by the bit obtained using VrE being output to the page register via the XDL latch. Similarly, for a middle page, bits of read data can be obtained and output using the read voltages VrB, VrD and VrF. Similarly, for an upper page, bits of read data can be obtained and output using the read voltages VrC and VrG.

The data transfer latch, denoted by XDL, also referred to an input/output latch, is provided for transferring data to/from the other latches and to/from the controller 122. In one approach, a separate data transfer latch is provided for each NAND string and sense circuit in a block. The XDL latches 194a, . . . , 195a may be represented by the set of data transfer latches X0 in FIG. 5A-5C.

The processor 192 performs computations, such as to determine the data stored in the sensed memory cell and store the determined data in the set of data latches. Each set of data latches 194, . . . , 195 is used to store data bits determined by processor 192 during a read operation, and to store data bits imported from the first data bus 120 during a program operation which represent write data meant to be programmed into the memory.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into the sets of data latches 194, . . . , 195.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194, . . . , 195 from the first data bus 120.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194, . . . , 195 may be implemented as a stack of data latches for each sense circuit, as depicted. In this embodiment, there are four data latches per sense circuit 60. In another embodiment, there is a number of data latches per sense circuit which is equal to In some implementations, the data latches are implemented as a shift register so that the parallel data stored therein is converted to serial data for first data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

Figures 2A, 2B:
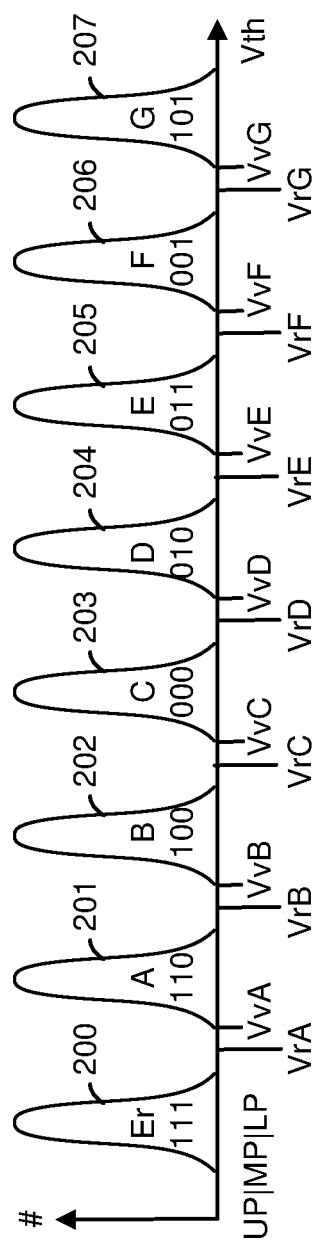
FIG. 2A depicts example data in the latches 194, . . . , 195 of FIG. 1B in a program or read operation.
FIG. 2B depicts a threshold voltage distribution of a set of memory cells, using eight data states, consistent with FIG. 2A.

FIG. 2A depicts example data in the latches 194, ..., 195 of FIG. 1B in a program or read operation. In this case, the memory cells each store three bits of data in one of eight data states. In a program operation, the write data can be received at the XDL latch from the controller and I/O circuits and transferred from the XDL latch to the LDL, MDL and UDL latches, for each NAND string. Once the write data is stored in the latches, program pulses can be applied to the selected word line.

In a read operation, a read voltage is applied to the selected word line while the respective memory cells are sensed to obtain read data. Read data can be transferred from one or more of the LDL, MDL and UDL latches to the XDL latch, and from there to the I/O circuits and the controller, for each NAND string.

Example bit assignments for each state are depicted. A lower, middle or upper bit can represent data of a lower, middle or upper page, respectively. Seven programmed data states A, B, C, D, E, F and G are used in addition to the erased state, Er. With these bit sequences, the data of the lower page can be determined by reading the memory cells using read voltages (e.g., control gate or word line voltages) of VrA and VrE. The lower page (LP) bit=1 if Vth<=VrA or Vth>VrE. LP=0 if VrA<Vth<=VrE. Generally, a memory cell can be sensed by a sense circuit while a read voltage is applied. If the memory cell is in a conductive state, its threshold voltage (Vth) is less than the read voltage. If the memory cell is in a non-conductive state, its Vth is greater than the read voltage.

The read voltages which are used to read a page of data are determined by transitions from 0 to 1 or 1 to 0 in the encoded bits (code word) for each state. For example, the LP bit transitions from 1 to 0 between Er and A, and from 0 to 1 between D and E. Accordingly, the read voltages for the LP are VrA and VrE.

The data of the middle page can be determined by reading the memory cells using read voltages VrB, VrD and VrF. The middle page (MP) bit=1 if Vth<=VrB or VrD<Vth<=VrF. MP=0 if VrB<Vth<=VrD or Vth>VrF. For example, referring to the encoded bits of FIG. 2B, the MP bit transitions from 1 to 0 between A and B, from 0 to 1 between C and D, and from 1 to between E and F. Accordingly, the read voltages for the MP are VrB, VrD and VrF.

The data of the upper page can be determined by reading the memory cells using read voltages of VrC and VrG. The upper page (UP) bit=1 if Vth<=VrC or Vth>VrG. UP=0 if VrC<Vth<=VrG. For example, referring to the encoded bits of FIG. 2B, the UP bit transitions from 1 to 0 between B and C, and from 0 to 1 between F and G. Accordingly, the read voltages for the UP are VrC and VrG.

A read operation can involve reading one page at a time. In this case, the read data for a page is obtained by the sense circuits and stored in the XDL latches for output to a controller.

FIG. 2B depicts a threshold voltage (Vth) distribution of a set of memory cells, using eight data states, consistent with FIG. 2A. The Vth distribution is achieved after performing a program operation. In one approach, the program operation may use incremental step pulse programming During the programming, program-verify iterations are performed for a selected word line. A program-verify iteration comprises a program portion in which a program voltage is applied to the word line followed by a verify portion in which one or more verify tests are performed. Each programmed state has a verify voltage which is used in the verify test for the state. For example, the verify voltages of the A, B, C, D, E, F and G states are VvA, VvB, VvC, VvD, VvE, VvF and VvG, respectively. The A, B, C, D, E, F and G states are represented by the Vth distributions 201, 202, 203, 204, 205, 206 and 207, respectively, and an example encoding of bits for each state is 111, 110, 100, 000, 010, 011, 001 and 101, respectively, in the format of UP|MP|LP. The read voltages VrA, VrB, VrC, VrD, VrE, VrF and VrG, consistent with FIG. 2A, are also depicted. The Er state is represented by the Vth distribution 200.

Figure 3:
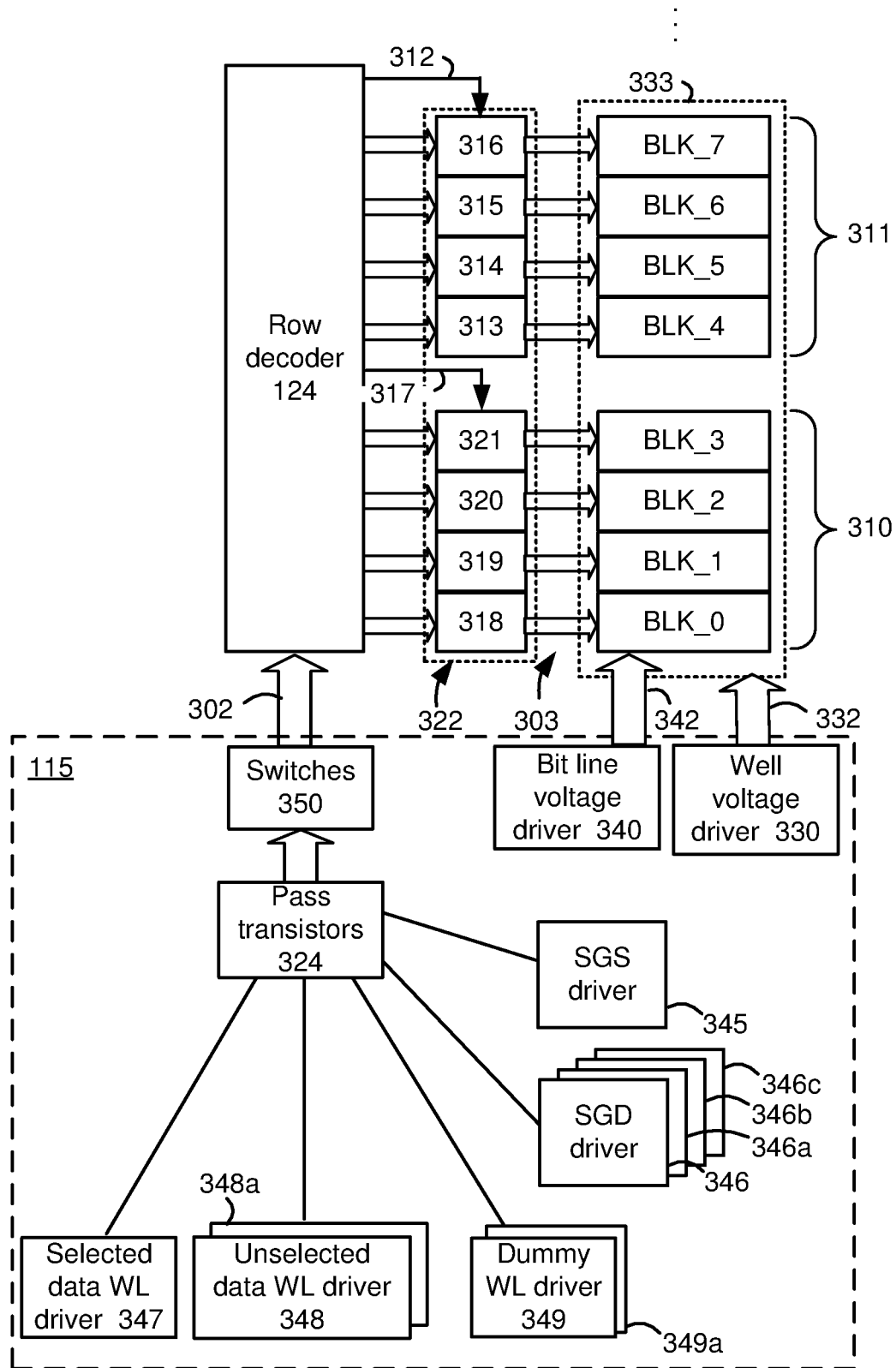
FIG. 3 depicts an example implementation of the power control module 115 of FIG. 1A for providing voltages to blocks of memory cells.

FIG. 3 depicts an example implementation of the power control module 115 of FIG. 1A for providing voltages to blocks of memory cells. In this example, the memory structure 126 includes a set 310 of four related blocks, BLK_0 to BLK_3, and another set 311 of four related blocks, BLK_4 to BLK_7. The blocks can be in one or more planes. The row decoder 124 of FIG. 1A provides voltages to word lines and select gates of each block via pass transistors 322. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 312 is connected to sets of pass transistors 313, 314, 315 and 316, which in turn are connected to control gate lines of BLK_4, BLK_5, BLK_6 and BLK_7, respectively. A control gate line 317 is connected to sets of pass transistors 318, 319, 320 and 321, which in turn are connected to control gate lines of BLK_0, BLK_1, BLK_2 and BLK_3, respectively.

Typically, program or read operations are performed on one selected block at a time and on one selected sub-block of the block. An erase operation may be performed on a selected block or sub-block. The row decoder can connect global control lines 302 to local control lines 303. The control lines represent conductive paths. Voltages are provided on the global control lines from a number of voltage drivers. Some of the voltage drivers may provide voltages to switches 350 which connect to the global control lines. Pass transistors 324 are controlled to pass voltages from the voltage drivers to the switches 350.

The voltage drivers can include a selected data word line (WL) driver 347, which provides a voltage on a data word line selected during a program or read operation. The driver 347 can provide a voltage on WLn. Drivers 348, 348a, 348b and 348c can be used for unselected data word lines, and dummy word line drivers 349 and 349a can be used to provide voltages on dummy word lines WLDD and WLDS, respectively, in FIG. 4A. For example, the driver 348 can be used to apply voltages to the drain-side unselected word lines and the driver 348a can be used to apply voltages to the source-side unselected word lines.

The voltage drivers can also include separate SGD drivers for each sub-block. For example, SGD drivers 346, 346a, 346b and 346c can be provided for SB0, SB1, SB2 and SB3, respectively, such as in FIG. 4A. In one option, an SGS driver 345 is common to the different sub-blocks in a block.

The various components, including the row decoder, may receive commands from a controller such as the state machine 112 or the controller 122 to perform the functions described herein.

The well voltage driver 330 provides a voltage Vsl to a well region 333 in the substrate, via control lines 332. The well voltage driver 330 is one example of a source line driver, where the well region is a source line, e.g., a conductive path connected to the source ends of the NAND strings. In one approach, the well region is common to the blocks. A set of bit lines 342 is also shared by the blocks. A bit line voltage driver 340 provides voltages to the bit lines. In a stacked memory device sets of connected memory cells may be arranged in NAND strings which extend vertically upward from the substrate. The bottom (or source end) of each NAND string is in contact with the substrate, e.g., the well region, and the top end (or drain end) of each NAND string is connected to a respective bit line, in one approach.

FIG. 4A depicts an example view of NAND strings in a block BLK0 in the memory structure 126 of FIG. 1A. A block comprises a plurality of memory cells. The primary NAND strings are arranged in sub-blocks of the block in a 3D configuration. Each sub-block includes multiple NAND strings, where one example NAND string is depicted. For example, SB0, SB1, SB2 and SB3 comprise example NAND strings 400n, 410n, 420n and 430n, respectively. The NAND strings have data word lines, dummy word lines and select gate lines. Each sub-block comprises a set of NAND strings which extend in the x direction and which have a common SGD line or control gate layer. The NAND strings 400n, 410n, 420n and 430n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB2, then programming WL1 in SB0, SB1, SB2 and then SB2, and so forth. The word line programming order may start at WL0, the source-end word line and end at WL95, the drain-end word line, for example.

The NAND strings 400n, 410n, 420n and 430n have channels 400a, 410a, 420a and 430a, respectively. Additionally, NAND string 400n includes SGS transistor 401, dummy memory cell 402, data memory cells 403-414, dummy memory cell 415 and SGD transistor 416. NAND string 410n includes SGS transistor 421, dummy memory cell 422, data memory cells 423-434, dummy memory cell 435 and SGD transistor 436. NAND string 420n includes SGS transistor 441, dummy memory cell 442, data memory cells 443-454, dummy memory cell 455 and SGD transistor 456. NAND string 430n includes SGS transistor 461, dummy memory cell 462, data memory cells 463-474, dummy memory cell 475 and SGD transistor 476.

This example depicts one SGD transistor at the drain-end of each NAND string, and one SGS transistor at the source-end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

Figure 4B:
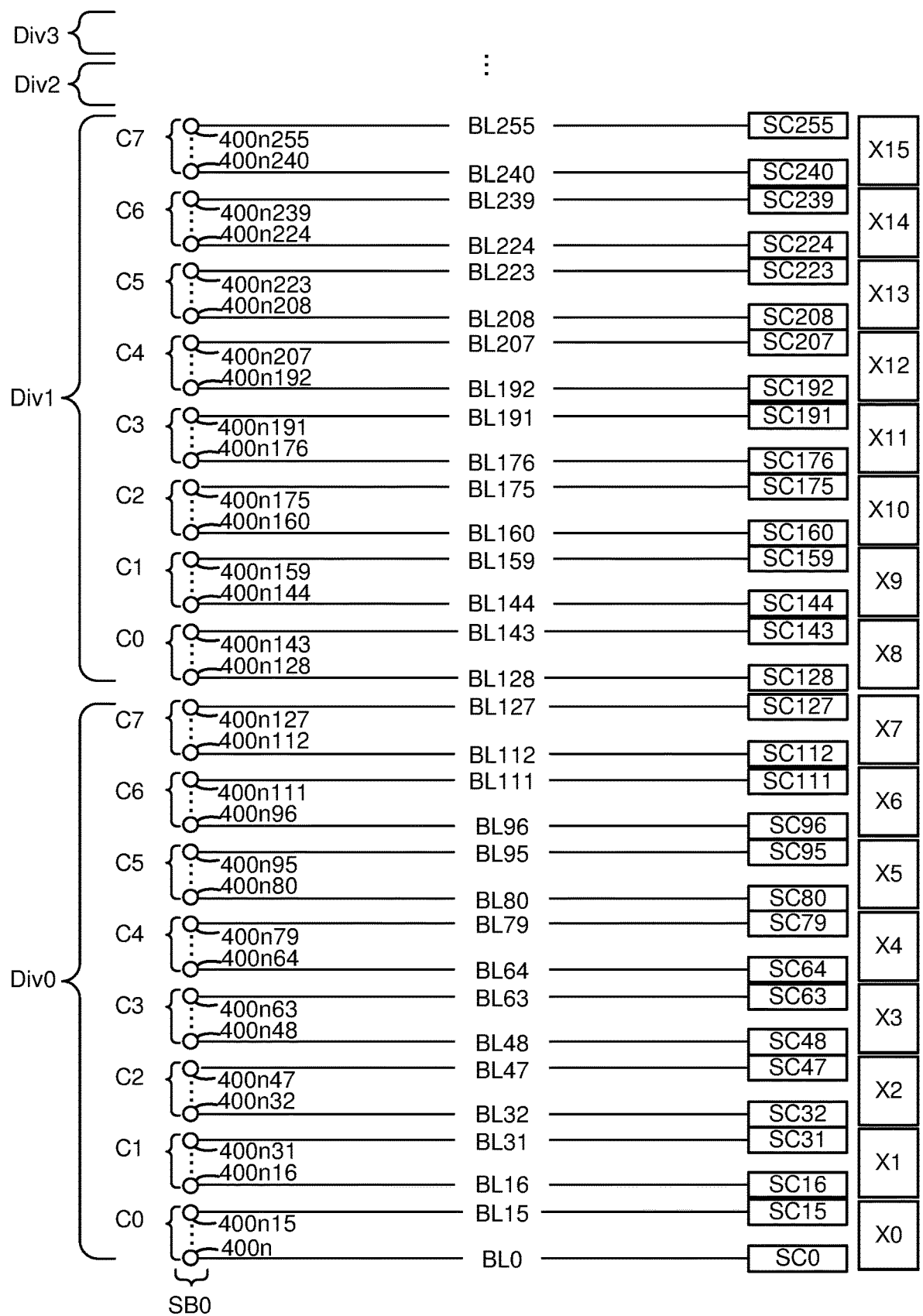
FIG. 4B depicts an example top view of SB0 in BLK0 of FIG. 4A, with columns of NAND strings arranged in four divisions Div0-Div3, in addition to details of bit lines, sense circuits and sets of data transfer latches, for Div0 and Div1.

FIG. 4B depicts an example top view of SB0 in BLK0 of FIG. 4A, with columns of NAND strings arranged in four divisions Div0-Div3, in addition to details of bit lines, sense circuits and sets of data transfer latches, for Div0 and Div1. In this example, each division comprises eight columns C0-C7 and each column comprises sixteen NAND strings. Associated sense circuits SC0-SC255 and sets of data transfer latches X0-X15 are also depicted. The divisions Div0-Div3, columns C0-C7 and sets of data transfer latches X0-X15 are consistent with FIGS. 5A and 5B. The sense circuits and sets of data transfer latches can be reused with NAND strings of other sub-blocks in the block.

The NAND strings are represented by circles. The NAND string 400n is also depicted in FIG. 4A. The use of four divisions, a set of eight columns per divisions and a set of sixteen NAND strings per column is an example only. Generally, any number of divisions of a block comprising two or more divisions can be used. Also, any number of columns in a division comprising two or more columns can be used.

Div0 includes: in C0, a set of sixteen NAND strings 400n-400n15 connected to a set of sixteen sense circuits SC0-SC15, respectively, and to a set of sixteen data transfer latches X0; in C1, NAND strings 400n16-400n31 connected to SC16-SC31, respectively, and to X1; in C2, NAND strings 400n32-400n47 connected to SC32-SC47, respectively, and to X2; in C3, NAND strings 400n48-400n63 connected to SC48-SC63, respectively, and to X3; in C4, NAND strings 400n64-400n79 connected to SC64-SC79, respectively, and to X4; in C5, NAND strings 400n80-400n95 connected to SC80-SC95, respectively, and to X5; in C6, NAND strings 400n96-400n111 connected to SC96-SC111, respectively, and to X6; and in C7, NAND strings 400n112-400n127 connected to SC112-SC127, respectively, and to X7.

Div1 includes: in C0, NAND strings 400n128-400n143 connected to sense circuits SC128-SC143, respectively, and to X8; in C1, NAND strings 400n144-400n159 connected to SC144-SC159, respectively, and to X9; in C2, NAND strings 400n160-400n175 connected to SC160-SC175, respectively, and to X10; in C3, NAND strings 400n176-400n191 connected to SC176-SC191, respectively, and to X11; in C4, NAND strings 400n192-400n207 connected to SC192-SC207, respectively, and to X12; in C5, NAND strings 400n208-400n223 connected to SC208-SC223, respectively, and to X13; in C6, NAND strings 400n224-400n239 connected to SC224-SC239, respectively, and to X14; and in C7, NAND strings 400n240-400n255 connected to SC240-SC257, respectively, and to X15.

Figure 4C:
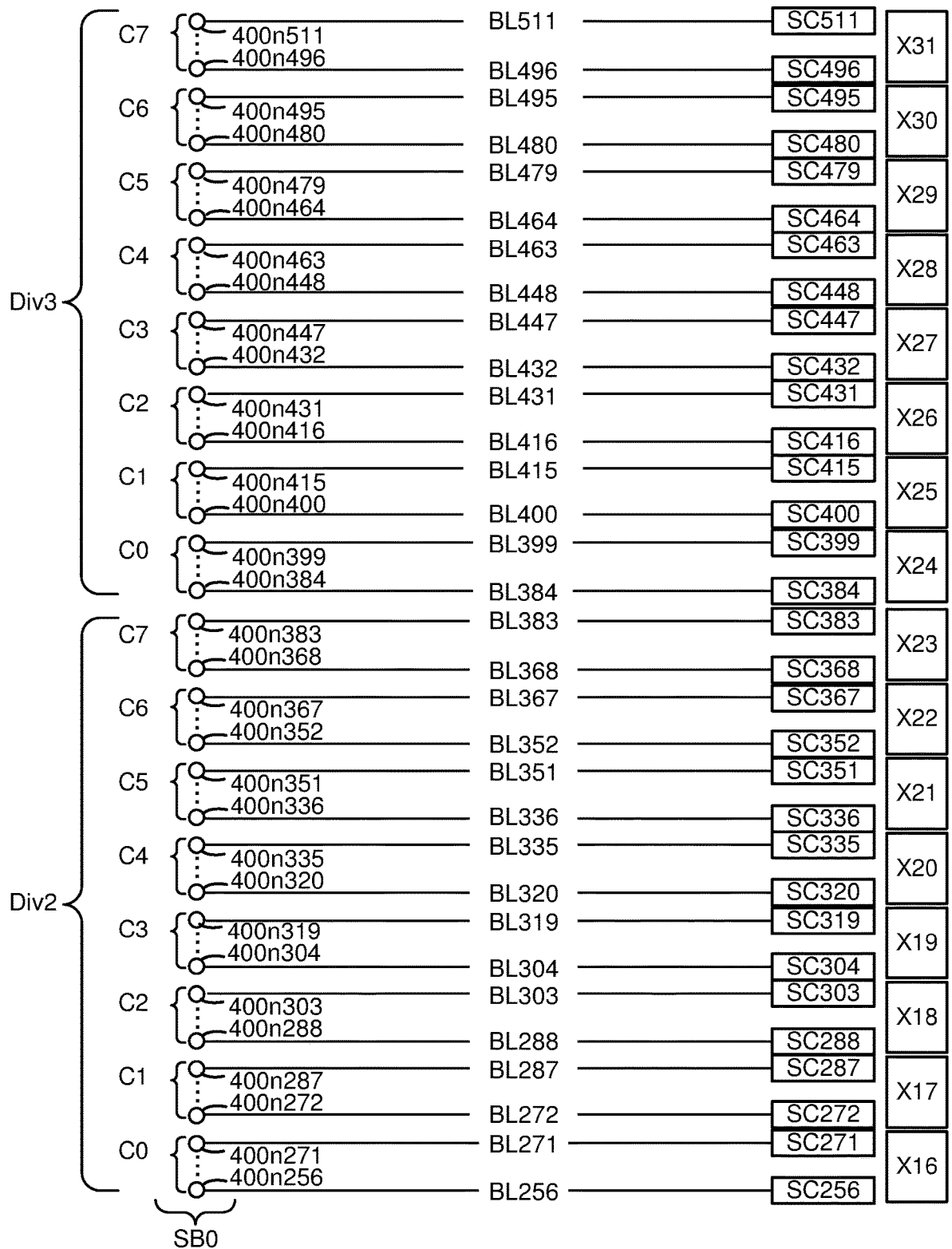
FIG. 4C depicts details of bit lines and sense circuits for Div2 and Div3, consistent with FIG. 4B.

Details of SB0 in Div2 and Div3 are provided in FIG. 4C.

FIG. 4C depicts details of bit lines and sense circuits for Div2 and Div3, consistent with FIG. 4B. In this example, each division comprises eight columns C0-C7 and each column comprises sixteen NAND strings. Associated sense circuits SC256-SC511 and sets of data transfer latches X16-X31 are also depicted. The divisions Div0-Div3, columns C0-C7 and sets of data transfer latches X15-X31 are consistent with FIGS. 5A and 5B.

Div2 includes: in C0, NAND strings 400n256-400n271 connected to sense circuits SC256-SC271, respectively, and to X16; in C1, NAND strings 400n272-400n287 connected to SC272-SC287, respectively, and to X17; in C2, NAND strings 400n288-400n303 connected to SC288-SC303, respectively, and to X18; in C3, NAND strings 400n304-400n319 connected to SC304-SC319, respectively, and to X19; in C4, NAND strings 400n320-400n335 connected to SC320-SC335, respectively, and to X20; in C5, NAND strings 400n336-400n351 connected to SC336-SC351, respectively, and to X21; in C6, NAND strings 400n352-400n367 connected to SC352-SC367, respectively, and to X22; and in C7, NAND strings 400n368-400n383 connected to SC368-SC383, respectively, and to X23.

Div3 includes: in C0, NAND strings 400n384-400n399 connected to sense circuits SC384-SC399, respectively, and to X24; in C1, NAND strings 400n400-400n415 connected to SC400-SC415, respectively, and to X25; in C2, NAND strings 400n416-400n431 connected to SC416-SC431, respectively, and to X26; in C3, NAND strings 400n432-400n447 connected to SC432-SC447, respectively, and to X27; in C4, NAND strings 400n448-400n463 connected to SC448-SC463, respectively, and to X28; in C5, NAND strings 400n464-400n479 connected to SC464-SC479, respectively, and to X29; in C6, NAND strings 400n480-400n495 connected to SC480-SC495, respectively, and to X30; and in C7, NAND strings 400n496-400n511 connected to SC496-SC511, respectively, and to X31.

FIG. 5A depicts an example configuration of a memory device consistent with FIGS. 1A and 4A-4C, showing a comparative example of transferring data out of latches, including data of a same column in each division in each transfer. The memory device includes memory cells in four divisions, Div0-Div3. Div0-Div3 each include a group 500-503, respectively, of eight columns of NAND strings, C0-C7. Data from the columns in Div0-Div3 are stored in groups 510-513 of sets of data transfer latches, respectively. In the groups 510 and 511, the sets of data transfer latches X0-X15 are consistent with FIG. 4B. In the groups 512 and 513, the sets of data transfer latches X16-X31 are consistent with FIG. 4C. For example, data from C0-C7 in Div0 is stored in the sets of data transfer latches X0-X7, respectively. Data from C0-C7 in Div1 is stored in the sets of data transfer latches X8-X15, respectively. Data from C0-C7 in Div2 is stored in the sets of data transfer latches X16-X23, respectively. Data from C0-C7 in Div3 is stored in the sets of data transfer latches X24-X31, respectively.

The sets of data transfer latches 510-513 communicate with a first bus 520 to transfer data in parallel to a data pipeline 521, for example. The data pipeline connects the data transfer latches to control latch circuits (see, e.g., FIGS. 5A and 5B) to allow data to move between them in input and output operations. The data pipeline comprises components for temporarily storing data. For example, the data pipeline may comprise flip flops that latch data received from the data transfer latches, in an output operation.

The data pipeline communicates with a second bus 522 to transfer data from the data transfer latches of Div0-Div3 in parallel to first through fourth control latch circuits (CLCs) 530-533, respectively, for example. Example configurations of the CLCs consistent with FIG. 5A are provided in FIG. 7A.

Data from each CLC is output via the first CLC 530 on a path 530a as a signal YIO23. The first through third CLCs 530-532 are responsive to a common multiplexer control signal, MUX_CTRL, for outputting data serially on the path 530a. In particular, data from Div0 which is received from the second bus and stored at the 1st CLC can be output directly on the path 533a. Data from Div1 which is received from the second bus and stored at the 2nd CLC can be output on a path 531a as a signal YIO01 to the 1st CLC, and then passed through the 1st CLC to the path 530a. Data from Div2 which is received from the second bus and stored at the 3rd CLC can be output on a path 532a as a signal YIO12 to the 2nd CLC, then passed through the 2nd CLC to the 1st CLC, and then passed through the 1st CLC to the path 530a. Data from Div3 which is received from the second bus and stored at the 4th CLC can be output on a path 533a as a signal YIO23 to the 3rd CLC, then passed through the 3rd CLC to the 2nd CLC, then passed through the 2nd CLC to the 1st CLC, and then passed through the 1st CLC to the path 530a.

A data transfer using the configuration of FIG. 5A is limited to transferring data from a same column in each division. An example first data transfer can include data from an nth, e.g., $6^{th}$, column C5 in each of Div0-Div3, as represented by the circled "1's." An example second data transfer can include data from an $n+1^{st}$, e.g., $7^{th}$, column C6 in each of Div0-Div3, as represented by the circled "2's," and so forth. A single column address which is independent of the divisions can be used to select a column of data which is involved in the transfer. A transfer can involve a column of each division, in one approach.

In the first data transfer, the data of the nth column in Div0-Div3 is transferred to the $1^{st}$ through $4^{th}$ CLCs, respectively. Under the control of a clock signal and MUX_CTRL (see also FIG. 8A), the nth column of Div0 is clocked out of the 1st CLC. Next, the nth column of Div1 is provided on the output path 530a by outputting it from the $2^{nd}$ CLC and passing it through the $1^{st}$ CLC. Next, the nth column of Div2 is provided on the output path 530a by outputting it from the $3^{rd}$ CLC and passing it through the $2^{nd}$ CLC and then the $1^{st}$ CLC. Finally, the nth column of Div3 is provided on the output path 530a by outputting it from the $4^{th}$ CLC and passing it through the $3^{rd}$ CLC and then the $2^{nd}$ CLC and then the $1^{st}$ CLC. The outputting of data from the CLCs can proceed similarly for the second and other subsequent data transfers.

FIG. 5B depicts an example configuration of a memory device consistent with FIGS. 1A and 4A-4C, showing an example of transferring data out of latches, including data of different columns in different divisions in each transfer. The configuration includes like-numbered components from FIG. 5A. This configuration differs in that the $1^{st}$ through $3^{rd}$ CLCs 540-542, respectively, each receive a separate, e.g., different, multiplexor signal MUX_CTRL0-MUX_CTRL2, respectively. This allows each of the CLCs 540-542 to output its own data or to pass through data from a following CLC in the CLC sequence. The CLC sequence starts at the $1^{st}$ CLC and ends at the $4^{th}$ CLC, in this example. The CLC sequence corresponds to the division sequence which starts at the first division, Div0, and ends at the 4th division, Div3.

A data transfer using the configuration of FIG. 5B is not limited to transferring data from a same column in each division. Instead, data can be transferred from different columns, e.g., two different, adjacent columns, in the divisions. An example first data transfer can include data from an n+1st, e.g., $7^{th}$, column C6 in each of Div0-Div2, and data from an nth, e.g., $6^{th}$, column C5 in Div3, as represented by the circled "1's." An example second data transfer can include data from an n+2nd, e.g., 8th, column C7 in each of Div0-Div2, and data from an n+1st, e.g., 7$^{th}$, column C6 in Div3, as represented by the circled "2's."

In the first data transfer, the data of the n+1st column in Div0-Div2 is transferred to the 1$^{st}$ through 3$^{rd}$ CLCs, respectively, and the data of the nth column in Div3 is transferred to the 4th CLC. Under the control of a clock signal and MUX_CTRL0-MUX_CTRL2 (see also FIG. 8B), the nth column of Div3 is provided on the output path 530a by outputting it from the 4$^{th}$ CLC and passing it through the 3$^{rd}$ CLC and then the 2$^{nd}$ CLC and then the 1$^{st}$ CLC. Next, the n+1st column of Div0 is provided on the output path 530a by outputting it from the Pt CLC. Next, the n+1st column of Div1 is provided on the output path 530a by outputting it from the 2nd CLC and passing it through the 1$^{st}$ CLC. Finally, the n+1st column of Div2 is provided on the output path 530a by outputting it from the 3$^{rd}$ CLC and passing it through the 2$^{nd}$ CLC and then the 1$^{st}$ CLC. The outputting of data from the CLCs can proceed similarly for the second and subsequent data transfers.

FIG. 5C depicts an example configuration of a circuit consistent with FIGS. 1B and 5B, where data is output from columns C0-C7 in Div0 via sets of data transfer latches X0-X7. Sixteen sense circuits, one for each NAND string, are depicted in each of columns C0-C7 of Div0. The sense circuits are depicted as rectangles above the internal bus 550. For example, the sense circuit 170 of FIG. 1B is depicted. The sense circuits of each column communicate with a processor via a respective bus. For example, the sense circuits of C0 communicate with the processor 192 of FIG. 1B via a bus DBUS. Similarly, the sense circuits of C1-C7 communicate with processors 192a-192g, respectively.

The processors 192-192g use the internal bus, within the memory chip, to communicate data from the sense circuits to the XDL data transfer latches, which are depicted as rectangles below the internal bus 550. The data transfer latches can be arranged in sets X0-X7, as discussed previously. In X0, the data transfer latch 194a of FIG. 1B is depicted. The data transfer latch 194a holds a bit of data received from the sense circuit 170, while the other data transfer latches in X0 each holds a bit of data received from a corresponding sense circuit of C0. Similarly, the data transfer latches in X1 each holds a bit of data received from a corresponding sense circuit of C1, and so forth.

In this example, data from one column at a time in each division is output in parallel to the first bus 520. For example, data from any of C0-C7 in Div0 can be output concurrently along with data of other divisions. Row access lines r1-r16 and column access lines 560-575 can be used to output data from a selected set of data transfer latches to the first bus 520. One of the columns in the division is selected based on first and second column addresses, Addr1 and Addr2, respectively. For example, in the first data transfer of FIG. 5B, Addr2 can select an nth column or Addr1 can select an n+1st column. When a column is selected, the associated data transfer latches are configured by appropriate control signals to output their data to the first bus.

FIG. 6A depicts a flowchart of an example process for transferring data from a set of latches in a first data transfer, consistent with FIG. 5B. Step 600 includes storing data from columns in data transfer latches, where the columns are arranged in a column sequence in each of M divisions, and the M divisions are arranged in a division sequence. For example, in FIG. 5B, the column sequence is C0-C7, starting at C0 and ending at C7, in each of M=4 divisions, Div0-Div3, and the M divisions are arranged in a division sequence of Div0-Div3, starting at Div0 and ending at Div3. M is an integer of two or more. In one approach, the data is transferred to the data transfer latches from any of data storage latches, e.g., LDL, MDL and UDL in FIG. 1B, by a sense circuit controller as in FIG. 5C, in a read operation of selected memory cells connected to a selected word line.

Step 601 includes beginning a first data transfer from the data transfer latches to a data pipeline via a first bus. Steps 602-604 can then be performed in parallel, in one approach. Step 602 notes that the transfer excludes data of an nth column in m initial divisions. "m" and "n" are integers of one or more. In the first data transfer of the example of FIG. 5B, n is the 6th column C5, and m=3 so that the transfer excludes data of C5 in the three initial divisions, Div0-Div2. Step 603 notes that the transfer includes data of the nth column in the M−m remaining divisions. For example, in the data transfer of FIG. 5B, M=4 divisions, and m=3, so that M−m=1. The transfer thus includes data of the 6th column C5 in the one remaining division of Div3. Step 604 notes that the transfer includes data of an n+1st column in the m initial divisions. For example, in the first data transfer of FIG. 5B, n+1=6+1=7, so that the transfer includes data of the 7th column C6 in the m=3 initial divisions of Div0-Div2.

Step 605 includes transferring data from the data pipeline to respective control latch circuits for the divisions via a second bus. See FIGS. 5B and 7B. Step 606 includes clocking data out of the respective control latch circuits starting with the respective control latch circuits of the M−m remaining divisions and concluding with the respective control latch circuits of the m initial divisions. For example, in the first data transfer of FIG. 5B, this involves clocking data out of the respective control latch circuits starting with the 4$^{th}$ CLC for the 4−3=1 remaining division of Div3 and concluding with the 1$^{st}$ through 3$^{rd}$ CLCs of the three initial divisions of Div0-Div2. Thus, data (e.g., C5) of Div3 is clocked out, followed by data (e.g., C6) of Div0, then Div1 and finally Div2.

In an example implementation of an apparatus, the first data transfer excludes data of the nth column of the m initial divisions.

The first bus is configured to transfer data from the data transfer latches to the data pipeline from the n+1st column of the m initial divisions responsive to a first column address (Addr1) which selects the n+1st column of the m initial divisions, and to transfer data from the data transfer latches to the data pipeline from the nth column of the M−m remaining divisions responsive to a second column address (Addr2) which selects the nth column of the M−m remaining divisions.

After the first data transfer, the first column address is incremented by one column and the second column address is incremented by one column; in response to the first column address being incremented by one column, the first bus is configured to transfer data from the data transfer latches to the data pipeline from an n+2nd column in the column sequence of the m≥1 initial divisions in a second data transfer; and in response to the second column address being incremented by one column, the first bus is configured to transfer data from the data transfer latches to the data pipeline from the n+1st column of the M−m remaining divisions in the second data transfer.

The first data transfer is an initial data transfer among a plurality of data transfers; and each data transfer of the plurality of data transfers is configured to transfer a bit from each NAND string of one column in each division.

The first data transfer transfers, in parallel, a bit from each NAND string of the n+1st column of the m initial divisions and a bit from each NAND string of the nth column of M−m remaining divisions.

In a further implementation of the apparatus, the apparatus comprises a second bus; and a set of M control latch circuits arranged serially in a respective sequence and connected to the second bus. The set of M control latch circuits comprises a respective control latch circuit for each division, each control latch circuit is configured to receive data of the respective division from the data pipeline via the second bus, the respective sequence comprising M−m control latch circuits configured to receive data of the nth column of the M−m remaining divisions and m control latch circuits configured to receive data of the n+1st column of the m initial divisions.

A first control latch circuit in the respective sequence is configured to clock out data from each of the control latch circuits in the set of M control latch circuits, one control latch circuit at a time, starting with the M−m control latch circuits and ending with the m control latch circuits.

First (e.g., $1^{st}$ CLC) through next-to-last (e.g., $3^{rd}$ CLC) respective control latch circuits of the set of control latch circuits each comprise a respective multiplexer (M0-M2, respectively; see FIG. 7B) responsive to a respective control signal (MUX_CTRL0-MUX_CTRL3, respectively), where the respective control signal is different for each of the first through next-to-last control latch circuits. For each of the first through next-to-last respective control latch circuits, the respective multiplexer is configured to pass data of the respective control latch circuit and to pass data of a next control latch circuit in the respective sequence at different times based on the respective control signals. See FIG. 8B.

In another example implementation, a method comprises: storing data from NAND strings in data transfer latches, the NAND strings are in a block, the block is divided into M divisions arranged in a division sequence, each division divided into columns arranged in a column sequence, and each column comprising contiguous NAND strings; and transferring data from the data transfer latches to a data pipeline, the transferring comprises transferring data from the data transfer latches for an n+1st column in the column sequence of m initial divisions in the division sequence and transferring data from the data transfer latches for an nth column in the column sequence of M−m remaining divisions in the division sequence, the remaining divisions are after m initial divisions in the division sequence.

The method can further comprise skipping a transfer of data from the data transfer latches to the data pipeline for the nth column of the m initial divisions. For example, in FIG. 5B, the nth column is skipped for Div0-Div3 in the first data transfer.

In a further implementation, the transferring of data from the data transfer latches for the n+1st column of the m initial divisions is responsive to a first column address which selects the n+1st column of the m initial divisions; and the transferring of data from the data transfer latches for the nth column of the M−m remaining divisions is responsive to a second column address which selects the nth column of the M−m remaining divisions.

The method can further comprise transferring data from the data pipeline to a set of M control latch circuits arranged serially in a respective sequence and comprising a respective control latch circuit for each division, the respective sequence comprises M−m control latch circuits configured to receive data of the nth column of the M−m remaining divisions and m control latch circuits configured to receive data of the n+1st column of the m initial divisions.

The method can further comprise clocking out data from each of the control latch circuits in the set of M control latch circuits via a first control latch circuit in the respective sequence, one control latch circuit at a time, starting with the M−m control latch circuits and ending with the m control latch circuits.

In a further example implementation, an apparatus comprises: data transfer latches connected to a block of memory cells, the block divided into M divisions arranged in a division sequence, from a first division to a last division, each division divided into columns arranged in a column sequence, the data transfer latches configured to concurrently store data from the columns of each division; and a circuit configured to transfer data from the data transfer latches to a data pipeline in a first data transfer, the first data transfer comprises data of an nth column in the column sequence from a selected division of the M divisions and any following divisions which are after the selected division in the division sequence, and excludes data of the nth column of one or more divisions which are before the selected division in the division sequence, and the selected division is after the first division in the division sequence, where n≥1, m≥1 and M≥2.

For example, in FIG. 5B, the first data transfer comprises data of the nth column from a selected division Div3. There are no following divisions which are after the selected division in the division sequence. The first data transfer excludes data of the nth column of one or more divisions, e.g., Div0-Div2, which are before the selected division in the division sequence.

The first data transfer may comprise data of an n+1st column in the column sequence of the one or more divisions which are before the selected division. For example, in FIG. 5B, the first data transfer comprise data of an n+1st column of the one or more divisions, e.g., Div0-Div2, which are before the selected division Div3.

As another example, in FIG. 10B, the first data transfer comprises data of the nth column from a selected division Div1. There are following divisions Div2 and Div3 which are after the selected division in the division sequence. The first data transfer includes the nth columns of Div2 and Div3 also. The first data transfer excludes data of the nth column of one or more divisions, e.g., Div0, which are before the selected division in the division sequence. Instead, the first data transfer comprises data of an n+1st column of the one or more divisions, e.g., Div0, which are before the selected division Div1.

A set of M control latch circuits may be configured to receive data of the first data transfer from the page buffer, and to clock out the data of the nth column of the selected division and the any following divisions, followed by the data of the n+1st column of the one or more divisions which are before the selected division.

First through next-to-last respective control latch circuits of the set of control latch circuits each comprise a respective multiplexer, each respective multiplexer is configured to pass data of its respective control latch circuit and to pass data of a next control latch circuit in the respective sequence at different times based on the respective control signals.

A first control latch circuit of the set of M control latch circuits may be configured to output the data of the nth column of the selected division and the any following divisions, followed by the data of the n+1st column of the one or more divisions which are before the selected division.

Figure 6B:
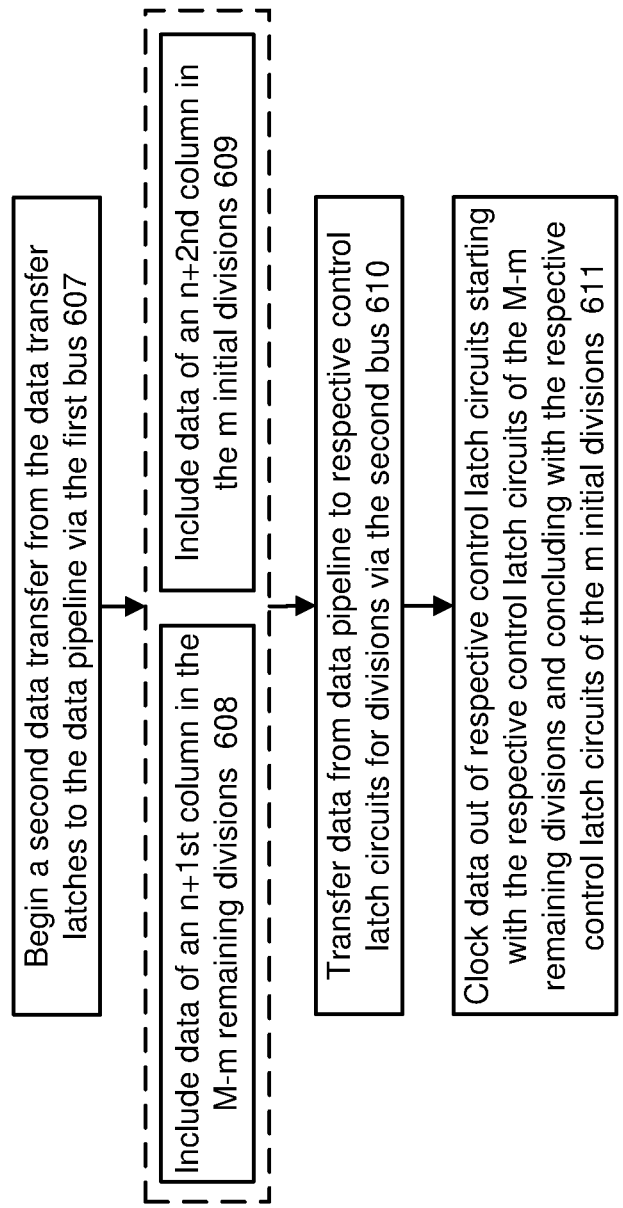
FIG. 6B depicts a flowchart of an example process for transferring data from a set of latches in a second data transfer which follows the first data transfer of FIG. 6A.

FIG. 6B depicts a flowchart of an example process for transferring data from a set of latches in a second data transfer which follows the first data transfer of FIG. 6A. As mentioned, one or more data transfers can occur where each transfer involves transferring data from each division of a block. A transfer of data from each division can be considered to be a data transfer cycle. One or more data transfers can be performed in response to commands from a controller, for example. Additional data transfers can follow this example second data transfer.

Step 607 begins a second data transfer from the data transfer latches to the data pipeline via the first bus. In the second data transfer of the example of FIG. 5B, n+1 is the 7th column C6, and m=3. Step 608 notes that the transfer includes data of the n+1st column in the M−m remaining divisions. The transfer thus includes data of the 7th column C6 in the one remaining division of Div3. Step 609 notes that the transfer includes data of an n+2nd column in the m initial divisions. For example, in the second data transfer of FIG. 5B, n+2=6+2=8, so that the transfer includes data of the 8th column C7 in the m=3 initial divisions of Div0-Div2.

Step 610 includes transferring data from the page buffer to respective control latch circuits via the second bus. Step 611 includes clocking data out of the respective control latch circuits starting with the respective control latch circuits of the M−m remaining divisions and concluding with the respective control latch circuits of the m initial divisions. For example, in the second data transfer of FIG. 5B, this involves clocking data out of the respective control latch circuits starting with the $4^{th}$ CLC for the 4−3=1 remaining division of Div3 and concluding with the $1^{st}$ through $3^{rd}$ CLCs of the three initial divisions of Div0-Div2. Thus, data (e.g., C6) of Div3 is clocked out, followed by data (e.g., C7) of Div0, then Div1 and finally Div2.

Figure 7A:
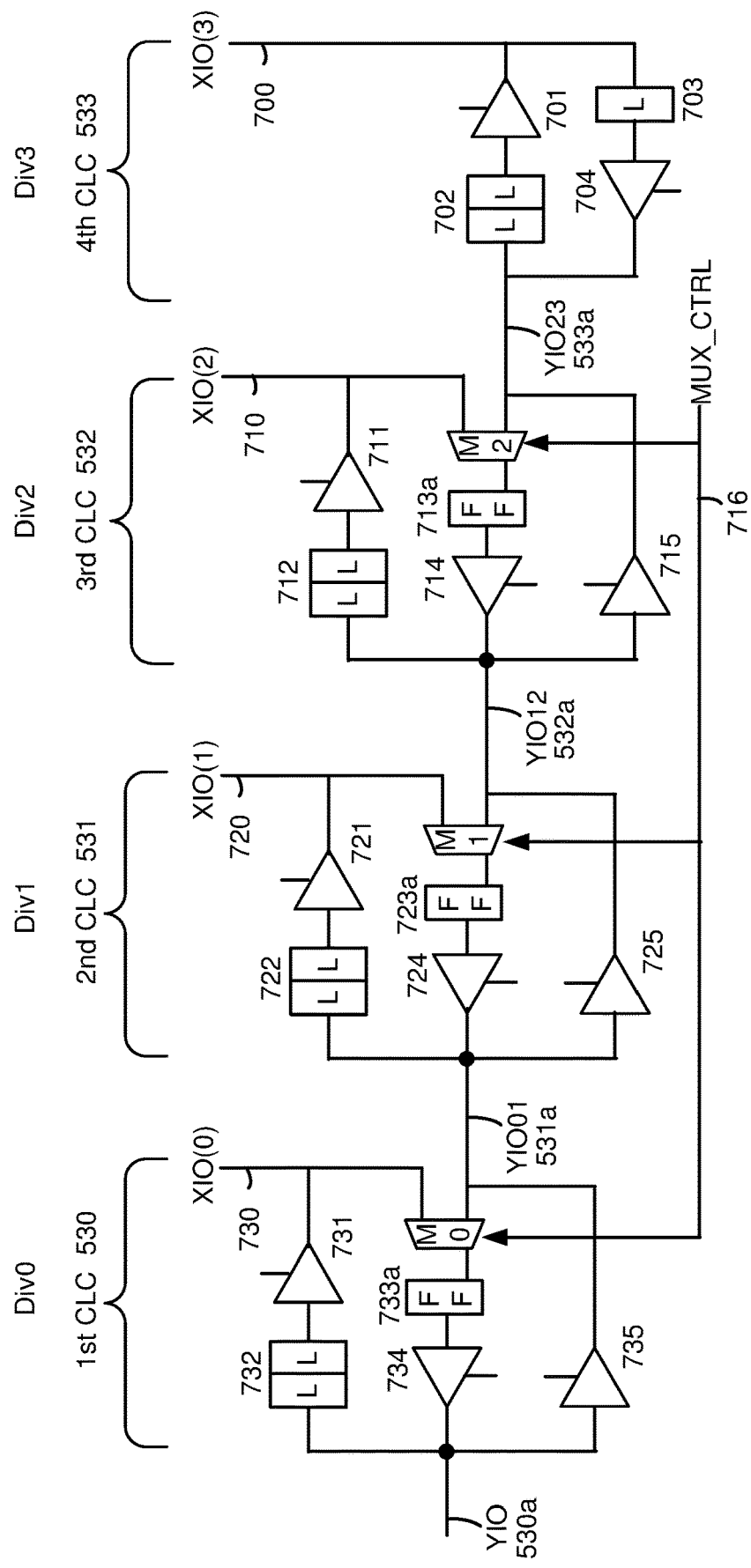
FIG. 7A depicts an example configuration of the control latch circuits 530-533 of FIG. 5A, including a common multiplexer control signal MUX_CTRL, consistent with the signals of FIG. 8A.

FIG. 7A depicts an example configuration of the control latch circuits 530-533 of FIG. 5A, including a common multiplexer control signal MUX_CTRL, consistent with the signals of FIG. 8A. Each control latch circuit can receive a bit of data from the page register, store it internally, and output it at a time indicated by control signals, such as in FIG. 8A. The control latch circuits are arranged in a sequence starting from the $1^{st}$ CLC 530 through the 4th CLC 533 in this example. The CLCs can be purely digital circuits, in one approach. The $1^{st}$ through $3^{rd}$ CLCs have a multiplexer which either passes data from a previous CLC in the sequence to an output path, or passes its own data, which it can store internally, on the output path.

The $1^{st}$ CLC includes an input path 730 for data XIO(0) from Div0. The input path is a first input to a multiplexer M0. A second input to M0 is an output path 531a of the 2nd CLC carrying data YIO01. An output of M0 is connected to a flip flop 733a. The output of the flip flop is connected to a tri-state buffer 734, which in turn is connected to an output path 530a carrying data YIO. Generally, a tri-state buffer in a non-inverting device which has an output equal to its input, acting like a closed switch, when its enable pin is high. At other times, the tri-state buffer has a high impedance and acts like an open switch. The tri-state buffer 734 is also connected to a tri-state buffer 735 and to latches 732. The latches 732 in turn are connected to a tri-state buffer 731 which is connected to the input path 730.

Generally, the data XIO can be received in parallel at the CLCs using a relatively slow clock and output serially as YIO using a relatively fast clock.

The $2^{nd}$ CLC includes an input path 720 for data XIO(1) from Div1. The input path is a first input to a multiplexer M1. A second input to M1 is an output path 532a of the 3rd CLC carrying data YIO12. An output of M1 is connected to a flip flop 723a. The output of the flip flop is connected to a tri-state buffer 724, which in turn is connected to the output path 531a. The tri-state buffer 724 is also connected to a tri-state buffer 725 and to latches 722. The latches 722 in turn are connected to a tri-state buffer 721 which is connected to the input path 720.

The $3^{rd}$ CLC includes an input path 710 for data XIO(2) from Div2. The input path is a first input to a multiplexer M2. A second input to M2 is an output path 533a of the 4th CLC carrying data YIO23. An output of M2 is connected to a flip flop 713a. The output of the flip flop is connected to a tri-state buffer 714, which in turn is connected to the output path 532a. The tri-state buffer 714 is also connected to a tri-state buffer 715 and to latches 712. The latches 712 in turn are connected to a tri-state buffer 711 which is connected to the input path 710.

The $4^{th}$ CLC includes an input path 700 for data XIO(3) from Div3. The input path is connected to a latch 703 which in turn is connected to a tri-state buffer 704. The tri-state buffer is connected to the output path 533a and to latches 702 which in turn are connected to a tri-state buffer 701. An output of the tri-state buffer is connected to the input path 700. The $4^{th}$ CLC (the last CLC in the sequence of four CLCs) differs from the $1^{st}$ through $3^{rd}$ CLCs in that it does not have a multiplexer, in this example. The multiplexer is not provided since the $4^{th}$ CLC does not have to choose between passing its own data or the data of a previous CLC. The $1^{st}$ through $3^{rd}$ CLCs are the first through next-to-last CLCs in the sequence. The $3^{rd}$ CLC is the next-to-last or penultimate CLC in the sequence.

The common MUX_CTRL control signal is provided on a path 716 to the multiplexers M0-M2. When the multiplexer control signal has one level, the respective multiplexer for each of the first through next-to-last respective control latch circuits are configured to pass data of the respective control latch circuit from the input paths 730, 720 and 710. If the respective control signal has another level, the respective multiplexer for each of the first through next-to-last respective control latch circuits is configured to pass data of the next control latch circuit. For example, if MUX_CTRL is high, M0, M1 and M2 pass the data on the input paths 730, 720 and 710, respectively, to the flip flops 733a, 723a and 713a, respectively. If MUX_CTRL is low, M0, M1 and M2 pass the data on the input paths 531a, 532a and 533a, respectively, to the flip flops 733a, 723a and 713a, respectively. The data in the flip flops 733a, 723a and 713a is then output on the output paths 530a, 531a and 532a, respectively.

The tri-state buffers 714, 724 and 734 are enabled during data stream out, e.g., from the CLCs to the controller, and the tri-state buffers 711, 715, 721, 725, 735 are enabled during data stream in, e.g., to the CLCs from the data pipeline.

Figure 7B:
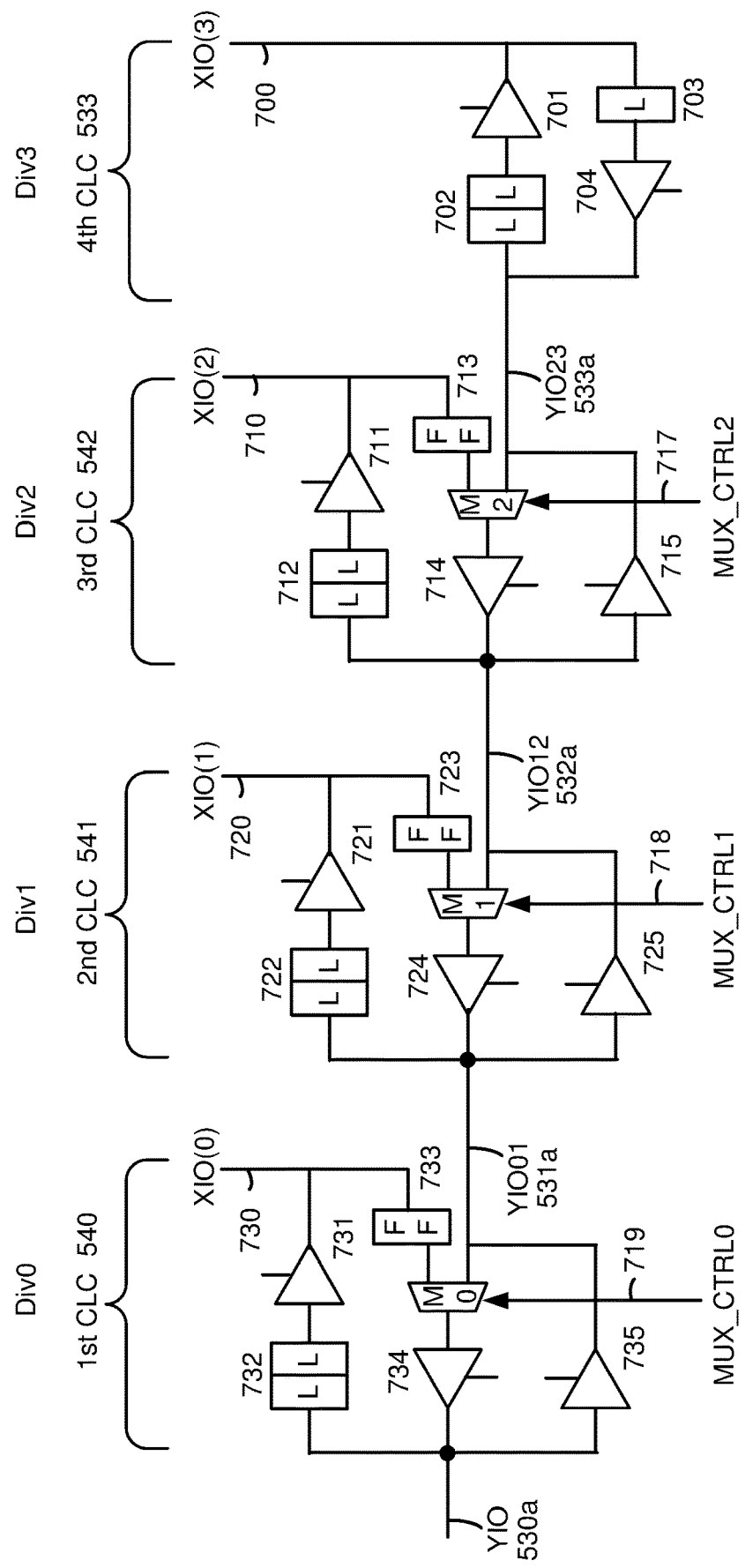
FIG. 7B depicts an example configuration of the control latch circuits 533 and 540-542 of FIG. 5B, including control signals MUX_CTRL0 to MUX_CTRL2 consistent with the processes of FIGS. 6A and 6B and with the signals of FIG. 8B.

FIG. 7B depicts an example configuration of the control latch circuits 533 and 540-542 of FIG. 5B, including control signals MUX_CTRL0 to MUX_CTRL2 consistent with the processes of FIGS. 6A and 6B and with the signals of FIG. 8B. The like-numbered components are the same as in FIG. 7A. The $4^{th}$ CLC is the same as in FIG. 7A but the $1^{st}$ CLC 540, $2^{nd}$ CLC 541 and $3^{rd}$ CLC 542 are different than their counterparts in FIG. 7A. The control latch circuits are arranged in a sequence starting from the 1st CLC through the $4^{th}$ CLC in this example. The $1^{st}$ through $3^{rd}$ CLCs have a multiplexer which either passes data from a previous CLC in the sequence to an output path, or passes its own data, which it can store internally, on the output path.

The 1$^{st}$ CLC includes an input path 730 for data XIO(0) from Div0. The input path is connected to a flip flop 733 which in turn is a first input to M0. A second input to M0 is YIO01, as mentioned. An output of M0 is connected to the tri-state buffer 734, which in turn is connected to the output path 530a. The tri-state buffer 734 is also connected to the tri-state buffer 735 and to the latches 732. The latches 732 in turn are connected to the tri-state buffer 731 which is connected to the input path 730.

The 2nd CLC includes an input path 720 for data XIO(1) from Div1. The input path is connected to a flip flop 723 which in turn is a first input to M1. A second input to M1 is YIO12. An output of M1 is connected to the tri-state buffer 724, which in turn is connected to the output path 531a. The tri-state buffer 724 is also connected to the tri-state buffer 725 and to the latches 722. The latches 722 in turn are connected to the tri-state buffer 721 which is connected to the input path 720.

The 3rd CLC includes an input path 710 for data XIO(2) from Div2. The input path is connected to a flip flop 713 which in turn is a first input to M2. A second input to M2 is YIO23, as mentioned. An output of M2 is connected to the tri-state buffer 714, which in turn is connected to the output path 532a. The tri-state buffer 714 is also connected to the tri-state buffer 715 and to latches 712. The latches 712 in turn are connected to the tri-state buffer 711 which is connected to the input path 710.

The 4th CLC is the same as in FIG. 7A, in this example. The 1st through 3rd CLCs are the first through next-to-last CLCs in the sequence.

A different control signal is provided to each of the multiplexers M0-M2. Specifically, MUX_CTRL0, MUX_CTRL1 and MUX_CTRL2 are provided on paths 719, 718 and 717 to the multiplexers M0-M2, respectively. Based on the multiplexer control signals, a respective multiplexer is configured to pass data of the control latch circuit from the input paths 730, 720 or 710 via the respective flip flop 733, 723 or 713, respectively, or to pass data of the next control latch circuit. See FIG. 8B.

Since the data of a CLC is held in the flip flop 733, 723 or 713, data of a next CLC in the sequence can be passed through out of turn. For example, the Div3 data of the 4th CLC can be passed through the multiplexers of the 1st through 3rd CLC to the output path 530a before data of any of Div0-Div2 is passed to the output path. When the Div3 data is passed through, the Div0-Div2 data can be stored in the flip flops 733, 723 and 713, respectively.

In one approach, for each of the first through next-to-last respective control latch circuits, the respective multiplexer is configured to pass data of the respective control latch circuit and to pass data of a next control latch circuit in the respective sequence at different times based on the respective control signals MUX_CTRL0-MUX_CTRL2.

FIG. 8A depicts example signals for clocking data out of the control latch circuits of FIGS. 5A and 7A. Signals 800-803 represent YIO, YIO01, YIO12 and YIO23, respectively. The signal 804 is a clock signal and the signal 805 is the MUX_CTRL signal. A time line ranging from t0-t9 is also depicted. When MUX_CTRL is high at t0-t1, the data of XIO(0)-XIO(2) is passed by the multiplexers M0-M2 to the flip flops 733a, 723a and 713a, respectively.

Also, starting at t0, the data of XIO(3) is output as YIO23. When CLK is high at t1-t2, the data of Div0 is output as YIO. This is the output of the set of control latch circuits which is provided to the I/O interface 540 in FIG. 5B. Also at t1-t2, the data of Div1 and Div2 is output as YIO01 and YIO12, respectively. When CLK is high at t3-t4, the data of Div1, Div2 and Div3 is output as YIO, YIO01 and YIO12, respectively. When CLK is high at t5-t6, the data of Div2 and Div3 is output as YIO and YIO01, respectively. When CLK is high at t7-t8, the data of Div3 is output as YIO. Thus, an nth column of data of Div0 is output followed by the nth column of data of Div1, then Div2 and finally Div3. The set of CLCs convert parallel data as an input to serial data as an output.

FIG. 8B depicts example signals for clocking data out of the control latch circuits of FIGS. 5B and 7B, consistent with the processes of FIGS. 6A and 6B. Signals 810-813 represent YIO, YIO01, YIO12 and YIO23, respectively. The signal 814 is a clock signal. The signals 815-817 are MUX_CTRL0-MUX_CTRL2, respectively. A time line ranging from t0-t8 is also depicted.

In this example, the data of an nth column of Div3 is output first, followed by the data of an n+1$^{st}$ column of Div0, then Div1 and finally Div2. When MUX_CTRL0-MUX_CTRL2 are low at t042, the Div3 data of XIO(3) is output from the 4$^{th}$ CLC as YIO23 and passed by the 3$^{rd}$ CLC as YIO12, then the 2$^{nd}$ CLC as YIO01 and finally by the 1st CLC as YIO. When MUX_CTRL0-MUX_CTRL2 are high at t2-t4, the Div0 data of XIO(0) is output from the 1$^{st}$ CLC as YIO, the Div1 data of XIO(1) is output from the 2$^{nd}$ CLC as YIO01, and the Div2 data of XIO(2) is output from the 3$^{rd}$ CLC as YIO12. When MUX_CTRL0 is low at t4-t6, the Div1 data of XIO(1) is passed by the 1$^{st}$ CLC as YIO. When MUX_CTRL1 is low at t6-t8, the Div2 data of XIO(2) is output from the 2$^{nd}$ CLC as YIO01 and passed by the 1$^{st}$ CLC as YIO.

FIG. 9A-12B depict examples of the generation of column addresses, such as by a controller, for use in data transfers as described herein. XYADR denotes an address generator. XYADR_BUF0-XYADR_BUF3 denote buffers for storing addresses for Div0-Div3, respectively. YSEL[9:0] denotes a 9-bit address such as for an nth column. YSEL[11:0] denotes a 11-bit address such as for an nth column. YSEL[10:0,11] denotes an 11-bit address which is obtained by shifting the address of YSEL[11:0] by one bit to select the next address, e.g., the n+1$^{st}$ column. The address can be shifted by one bit to select a next column.

In the examples, data from each division is transferred from the output data latches to the page register and then to the CLCs, and then output to the controller. In some examples, the data from one or more divisions is not needed by the controller and is discarded, resulting in a time penalty. The techniques described herein avoid this time penalty by ensuring that unrequested columns of data are not transferred.

FIG. 9A depicts an example of column addresses for transferring data for use with the example of FIGS. 5A and 7A, where the transfer comprises an nth column of Div0-Div3, and no data is discarded. Each division receives the same address so that the same column, e.g., the nth column is selected for a data transfer. Also, the initial address is for Div0, indicating that the controller requests a data transfer involving the nth column from each of Div0-Div3, for example. In this case, the nth column from each division is transferred and no data is discarded, e.g., not used by the controller.

FIG. 9B depicts an example of column addresses for transferring data for use with the example of FIGS. 5B and 7B, where the transfer comprises an nth column of Div0-Div3, and no data is discarded. Each division receives the same address so that the same column, e.g., the nth column, is selected for a data transfer. The situation is therefore the same as that of FIG. 9A.

FIG. 10A depicts an example of column addresses for transferring data for use with the example of FIGS. 5A and 7A, where the transfer comprises an nth column of Div0-Div3 and data from the nth column of Div0 is discarded. As before, the nth column from each division is transferred. However, the example assumes the controller does not need the data of the nth column of Div0 but has no way to exclude it from being transferred. The controller therefore has to discard the nth column of Div0 after time is spent reading it in, resulting in a time penalty. The buffer which stores an address of an unneeded column is shown by dashed lines.

FIG. 10B depicts an example of column addresses for transferring data for use with the example of FIGS. 5B and 7B, where the transfer comprises an nth column of Div1-Div3 and an n+1$^{st}$ column of Div0, and no data is discarded. The techniques provided herein allow an initial address to be set for Div1, indicating that the controller requests a data transfer involving the nth column from each of Div1-Div3 but not from Div0. The address for Div0 is incremented relative to the address for the nth column of Div1-Div3 to identify the n+1$^{st}$ column. The controller therefore does not discard any data and avoids a time penalty.

In a first data transfer, YSEL[10:0,11] is an example of a first column address which selects the n+1$^{st}$ column of m=1 initial divisions, e.g., Div0, and YSEL[11:0] is an example of a second column address which selects an nth column of M−m=4−1=3 remaining divisions, e.g., Div1-Div3.

FIG. 11A depicts an example of column addresses for transferring data for use with the example of FIGS. 5A and 7A, where the transfer comprises an nth column of Div0-Div3 and data from the nth column of Div0 and Div1 is discarded. As before, the nth column from each division is transferred. However, the example assumes the controller does not need the data of the nth column of Div0 and Div1 but has no way to exclude it from being transferred. The controller therefore has to discard the nth column of Div0 and Div1, resulting in a time penalty.

FIG. 11B depicts an example of column addresses for transferring data for use with the example of FIGS. 5B and 7B, where the transfer comprises an nth column of Div2 and Div3 and an n+1$^{st}$ column of Div0 and Div1, and no data is discarded. The techniques provided herein allow an initial address to be set for Div2, indicating that the controller requests a data transfer involving the nth column from Div2 and Div3 but not from Div0 and Div1. The address for Div0 and Div1 is incremented relative to the address for the nth column of Div2 and Div3 to identify the n+1$^{st}$ column. The controller therefore does not discard any data and avoids a time penalty.

In a first data transfer, YSEL[10:0,11] is an example of a first column address which selects the n+1$^{st}$ column of m=2 initial divisions, e.g., Div0 and Div1, and YSEL[11:0] is an example of a second column address which selects an nth column of M−m=4−2=2 remaining divisions, e.g., Div2 and Div3.

FIG. 12A depicts an example of column addresses for transferring data for use with the example of FIGS. 5A and 7A, where the transfer comprises an nth column of Div0-Div3 and data from the nth column of Div0-Div2 is discarded. As before, the nth column from each division is transferred. However, the example assumes the controller does not need the data of the nth column of Div0-Div2 but has no way to exclude it from being transferred. The controller therefore has to discard the nth column of Div0-Div2, resulting in a time penalty. Note that the time penalty is greater when the number of divisions is greater and when the initial address is greater, so that a greater number of columns of data are discarded.

FIG. 12B depicts an example of column addresses for transferring data for use with the example of FIGS. 5B and 7B, where the transfer comprises an nth column of Div3 and an n+1$^{st}$ column of Div0-Div2, and no data is discarded. The techniques provided herein allow an initial address to be set for Div3, indicating that the controller requests a data transfer involving the nth column from Div3 but not from Div0-Div2. The address for Div0-Div2 is incremented relative to the address for the nth column of Div3 to identify the n+1st column. The controller therefore does not discard any data and avoids a time penalty.

In a first data transfer, YSEL[10:0,11] is an example of a first column address which selects the n+1st column of m=3 initial divisions, e.g., Div0-Div2, and YSEL[11:0] is an example of a second column address which selects an nth column of M−m=4−3=1 remaining division, e.g., Div3.

Accordingly, it can be see that in one implementation, an apparatus comprises: a plurality of memory cells arranged in NAND strings in a block, the block divided into M divisions arranged in a division sequence, each division divided into columns arranged in a column sequence, and each column comprising contiguous NAND strings; data transfer latches connected to the NAND strings and configured to store data from the columns of each division; a first bus connected to the data transfer latches; and a data pipeline connected to the first bus, the first bus is configured to transfer data from the data transfer latches to the data pipeline in a first data transfer, the first data transfer comprises data of an n+1st column in the column sequence of m initial divisions in the division sequence, and data of an nth column in the column sequence of M−m remaining divisions in the division sequence which follow the m initial divisions, where n≥1, m≥1 and M≥2.

In another implementation, a method comprises: storing data from NAND strings in data transfer latches, the NAND strings are in a block, the block is divided into M divisions arranged in a division sequence, each division divided into columns arranged in a column sequence, and each column comprising contiguous NAND strings; and transferring data from the data transfer latches to a data pipeline, the transferring comprises transferring data from the data transfer latches for an n+1st column in the column sequence of m initial divisions in the division sequence and transferring data from the data transfer latches for an nth column in the column sequence of M−m remaining divisions in the division sequence, the remaining divisions are after m initial divisions in the division sequence.

In another implementation, an apparatus comprises: data transfer latches connected to a block of memory cells, the block divided into M divisions arranged in a division sequence, from a first division to a last division, each division divided into columns arranged in a column sequence, the data transfer latches configured to concurrently store data from the columns of each division; and a circuit configured to transfer data from the data transfer latches to a data pipeline in a first data transfer, the first data transfer comprises data of an nth column in the column sequence from a selected division of the M divisions and any following divisions which are after the selected division in the division sequence, and excludes data of the nth column of one or more divisions which are before the selected division in the division sequence, and the selected division is after the first division in the division sequence.

The foregoing detailed description of the invention has been presented for purposes of illustration and description.

It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a plurality of memory cells arranged in NAND strings in a block, the block divided into M divisions arranged in a division sequence, each division divided into columns arranged in a column sequence, and each column comprising contiguous NAND strings;
data transfer latches connected to the NAND strings and configured to store data from the columns of each division;
a first bus connected to the data transfer latches; and
a data pipeline connected to the first bus, the first bus is configured to transfer data from the data transfer latches to the data pipeline in a first data transfer, the first data transfer comprises data of an $n+1^{st}$ column in the column sequence of m initial divisions in the division sequence, and data of an nth column in the column sequence of M−m remaining divisions in the division sequence which follow the m initial divisions, where $n \geq 1$, $m \geq 1$ and $M \geq 2$.

2. The apparatus of claim 1, wherein:
the first data transfer excludes data of the nth column of the m initial divisions.

3. The apparatus of claim 1, wherein:
the first bus is configured to transfer data from the data transfer latches to the data pipeline from the $n+1^{st}$ column of the m initial divisions responsive to a first column address which selects the $n+1^{st}$ column of the m initial divisions, and to transfer data from the data transfer latches to the data pipeline from the nth column of the M−m remaining divisions responsive to a second column address which selects the nth column of the M−m remaining divisions.

4. The apparatus of claim 3, wherein:
after the first data transfer, the first column address is incremented by one column and the second column address is incremented by one column;
in response to the first column address being incremented by one column, the first bus is configured to transfer data from the data transfer latches to the data pipeline from an $n+2^{nd}$ column in the column sequence of the $m \geq 1$ initial divisions in a second data transfer; and
in response to the second column address being incremented by one column, the first bus is configured to transfer data from the data transfer latches to the data pipeline from the n+1st column of the M−m remaining divisions in the second data transfer.

5. The apparatus of claim 1, wherein:
the first data transfer is an initial data transfer among a plurality of data transfers; and
each data transfer of the plurality of data transfers is configured to transfer a bit from each NAND string of a column in each division.

6. The apparatus of claim 1, wherein:
the first data transfer transfers, in parallel, a bit from each NAND string of the $n+1^{st}$ column of the m initial divisions and a bit from each NAND string of the nth column of M−m remaining divisions.

7. The apparatus of claim 1, further comprising:
a second bus; and
a set of M control latch circuits arranged serially in a respective sequence and connected to the second bus, the set of M control latch circuits comprising a respective control latch circuit for each division, each control latch circuit is configured to receive data of the respective division from the data pipeline via the second bus, the respective sequence comprising M−m control latch circuits configured to receive data of the nth column of the M−m remaining divisions and m control latch circuits configured to receive data of the $n+1^{st}$ column of the m initial divisions.

8. The apparatus of claim 7, wherein:
a first control latch circuit in the respective sequence is configured to clock out data from each of the control latch circuits in the set of M control latch circuits, one control latch circuit at a time, starting with the M−m control latch circuits and ending with the m control latch circuits.

9. The apparatus of claim 7, wherein:
first through next-to-last respective control latch circuits of the set of control latch circuits each comprise a respective multiplexer responsive to a respective control signal, the respective control signal is different for each of the first through next-to-last control latch circuits.

10. The apparatus of claim 9, wherein:
for each of the first through next-to-last respective control latch circuits, the respective multiplexer is configured to pass data of the respective control latch circuit and to pass data of a next control latch circuit at different times based on the respective control signals.

11. A method, comprising:
storing data from NAND strings in data transfer latches, the NAND strings are in a block, the block is divided into M divisions arranged in a division sequence, each division divided into columns arranged in a column sequence, and each column comprising contiguous NAND strings; and
transferring data from the data transfer latches to a data pipeline, the transferring comprises transferring data from the data transfer latches for an $n+1^{st}$ column in the column sequence of m initial divisions in the division sequence and transferring data from the data transfer latches for an nth column in the column sequence of M−m remaining divisions in the division sequence, the remaining divisions are after m initial divisions in the division sequence.

12. The method of claim 11, further comprising:
skipping a transfer of data from the data transfer latches to the data pipeline for the nth column of the m initial divisions.

13. The method of claim 11, wherein:
the transferring of data from the data transfer latches for the $n+1^{st}$ column of the m initial divisions is responsive to a first column address which selects the $n+1^{st}$ column of the m initial divisions; and
the transferring of data from the data transfer latches for the nth column of the M−m remaining divisions is responsive to a second column address which selects the nth column of the M−m remaining divisions.

14. The method of claim 11, further comprising:
transferring data from the data pipeline to a set of M control latch circuits arranged serially in a respective sequence and comprising a respective control latch circuit for each division, the respective sequence comprises M−m control latch circuits configured to receive data of the nth column of the M−m remaining divisions and m control latch circuits configured to receive data of the n+1$^{st}$ column of the m initial divisions.

15. The method of claim 14, further comprising:

clocking out data from each of the control latch circuits in the set of M control latch circuits via a first control latch circuit in the respective sequence, one control latch circuit at a time, starting with the M−m control latch circuits and ending with the m control latch circuits.

16. An apparatus, comprising:

data transfer latches configured to connect to a block of memory cells, the block divided into M divisions arranged in a division sequence, from a first division to a last division, each division divided into columns arranged in a column sequence, the data transfer latches configured to concurrently store data from the columns of each division; and a circuit configured to transfer data from the data transfer latches to a data pipeline in a first data transfer, the first data transfer comprises data of an nth column in the column sequence from a selected division of the M divisions and any following divisions which are after the selected division in the division sequence, and excludes data of the nth column of one or more divisions which are before the selected division in the division sequence, and the selected division is after the first division in the division sequence, where n≥1, m≥1 and M≥2.

17. The apparatus of claim 16, wherein:

the first data transfer comprises data of an n+1$^{st}$ column in the column sequence of the one or more divisions which are before the selected division.

18. The apparatus of claim 17, further comprising:

a set of M control latch circuits configured to receive data of the first data transfer from the data pipeline, and to clock out the data of the nth column of the selected division and the any following divisions, followed by the data of the n+1$^{st}$ column of the one or more divisions which are before the selected division.

19. The apparatus of claim 18, wherein:

first through next-to-last respective control latch circuits of the set of control latch circuits each comprise a respective multiplexer, each respective multiplexer is configured to pass data of its respective control latch circuit and to pass data of a next control latch circuit in the respective sequence at different times based on the respective control signals.

20. The apparatus of claim 18, wherein:

a first control latch circuit of the set of M control latch circuits is configured to output the data of the nth column of the selected division and the any following divisions, followed by the data of the n+1$^{st}$ column of the one or more divisions which are before the selected division.

* * * * *